United States Patent
Takeda et al.

(10) Patent No.: US 6,593,056 B2
(45) Date of Patent: Jul. 15, 2003

(54) CHEMICALLY AMPLIFIED POSITIVE RESIST COMPOSITION AND PATTERNING METHOD

(75) Inventors: Takanobu Takeda, Niigata-ken (JP); Jun Watanabe, Niigata-ken (JP); Katsuya Takemura, Niigata-ken (JP); Kenji Koizumi, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 133 days.

(21) Appl. No.: 09/814,049

(22) Filed: Mar. 22, 2001

(65) Prior Publication Data

US 2001/0035394 A1 Nov. 1, 2001

(30) Foreign Application Priority Data

Mar. 22, 2000 (JP) .......................... 2000-079414

(51) Int. Cl.$^7$ ............................ G03F 7/039; G03F 7/30
(52) U.S. Cl. .................... 430/170; 430/270.1; 430/326; 430/330; 430/905
(58) Field of Search .................... 430/270.1, 170, 430/326, 330, 905

(56) References Cited

U.S. PATENT DOCUMENTS

| 5,496,678 A | | 3/1996 | Imai et al. ................ 430/126 |
| 5,939,235 A | * | 8/1999 | Kondo et al. ............ 430/270.1 |
| 5,942,367 A | | 8/1999 | Watanabe et al. .......... 430/170 |
| 6,511,785 B1 | * | 1/2003 | Takemura et al. ....... 430/270.1 |

FOREIGN PATENT DOCUMENTS

| EP | 562819 | 9/1993 |
| EP | 1039346 | 9/2000 |
| EP | 1077391 | 2/2001 |
| EP | 1099983 | 5/2001 |

* cited by examiner

*Primary Examiner*—John S. Chu
(74) *Attorney, Agent, or Firm*—Millen, White, Zelano & Branigan, P.C.

(57) ABSTRACT

A chemically amplified, positive resist composition comprising an organic solvent, a polymer having acid labile groups, a photoacid generator, a basic compound, and a compound containing at least two allyloxy groups is provided. The resist composition has a high sensitivity, resolution, dry etching resistance and process adaptability, and is improved in the slimming of a pattern film after development with an aqueous base solution. The resist composition is also applicable to the thermal flow process suited for forming a microsize contact hole pattern for the fabrication of VLSI.

17 Claims, 2 Drawing Sheets

CHEMICALLY AMPLIFIED POSITIVE RESIST COMPOSITION AND PATTERNING METHOD

TECHNICAL FIELD

This invention relates to a chemically amplified positive resist composition having a high resolution, dry etching resistance, and minimized slimming of a pattern film after development, and useful as a micropatterning material especially for the manufacture of VLSI.

It also relates to a chemically amplified positive resist composition for forming a contact hole pattern by the thermal flow process. While a method for forming a contact hole pattern using a chemically amplified positive resist composition comprising a polymer as the base resin involves the thermal flow step of heat treating the contact hole pattern for further reducing the size of contact holes, the invention relates to the resist composition to which a compound having functional groups capable of crosslinking with the polymer is added so that the size reduction by thermal flow becomes easy to control. The invention further relates to a method for forming a microsize contact hole pattern in the manufacture of VLSIs.

BACKGROUND ART

While a number of recent efforts are being made to achieve a finer pattern rule in the drive for higher integration and operating speeds in LSI devices, deep-ultraviolet, EB, EUV and x-ray lithography is thought to hold particular promise as the next generation in microfabrication technology. Deep-UV lithography is capable of achieving a minimum feature size of 0.3 μm or less and, when a resist having low light absorption is used, can form patterns with sidewalls that are nearly perpendicular to the substrate.

Recently developed acid-catalyzed chemically amplified positive resists, such as those described in JP-B 2-27660, JP-A 63-27829, U.S. Pat. No. 4,491,628 and U.S. Pat. No. 5,310,619, utilize a high-intensity KrF or ArF excimer laser as the deep-UV light source. These resists, with their excellent properties such as high sensitivity, high resolution, and good dry etching resistance, are especially promising for deep-UV lithography.

Such chemically amplified positive resist compositions include two-component systems comprising a base resin and a photoacid generator, and three-component systems comprising a base resin, a photoacid generator, and a dissolution regulator having acid labile groups.

For example, JP-A 62-115440 describes a resist composition comprising poly-4-tert-butoxystyrene and a photoacid generator, and JP-A 3-223858 describes a similar two-component resist composition comprising a resin bearing tert-butoxy groups within the molecule, in combination with a photoacid generator. JP-A 4-211258 describes a two-component resist composition which is comprised of polyhydroxystyrene bearing methyl, isopropyl, tert-butyl, tetrahydropyranyl, and trimethylsilyl groups, together with a photoacid generator. JP-A 6-100488 discloses a resist composition comprising a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator. These resists, however, have the drawbacks of slimming of a pattern film after development with an aqueous base solution and poor resistance to dry etching.

Also known in the art are resist compositions using copolymers of hydroxystyrene with (meth)acrylate for achieving a higher transparency and improving the adhesion to the substrate as disclosed in JP-A 8-101509 and 8-146610. The resist compositions of this type suffer from low heat resistance, partial pattern collapse, and pattern shape footing.

Improvement and development efforts have been continuously made on the base resin in resist compositions of this type. JP-A 10-207066 discloses a resist composition comprising a base resin which is crosslinked with crosslinking groups having C—O—C linkages and a photoacid generator wherein the crosslinking groups are eliminated under the action of acid generated from the photoacid generator upon exposure, achieving a high contrast and high resolution.

Even when any base resin designed to enhance the resolving power is used in such chemically amplified positive resist compositions, it is yet difficult to reach a contact hole size of 0.20 μm or less. There are available no resist compositions for forming a contact hole pattern satisfying the requirement of LSI devices of the next generation.

On the other hand, the known technology of forming a contact hole size of 0.20 μm or less is to heat treat a contact hole pattern for causing the resist film to flow and reducing the contact hole size. This technology is known as thermal flow process. The use of the thermal flow process enables formation of a miniature contact hole size as fine as 0.10 μm or 0.15 μm.

In forming microsize contact holes by the thermal flow process, however, it is very difficult to control the heat treating temperature so as to provide a shrinkage matching with the desired contact hole size. That is, the thermal flow process has the drawback that even a slight variation of heating temperature brings about a substantial variation of contact hole size.

Referring to FIG. 1, there is illustrated in cross section a resist film 2 on a substrate 1, a contact hole 3 being formed through the resist film 2. The contact hole having undergone the thermal flow process has a profile as shown in FIG. 1, that is, a cross-sectional profile bowed at corners. The thermal flow process also has the problem that the profile of a contact hole is deteriorated.

SUMMARY OF THE INVENTION

An object of the invention is to provide a chemical amplification type, positive working resist composition which has a higher sensitivity, resolution, dry etching resistance and process adaptability than conventional resist compositions, and is improved in the slimming of a pattern film after development with an aqueous base solution.

Another object of the invention is to provide a novel and improved chemical amplification type, positive working resist composition which has controllable process adaptability relative to the heat treating temperature when a microsize contact hole pattern is conventionally formed by the thermal flow process, and thus has satisfactory practical utility. A further object is to provide a novel and improved method for forming a contact hole pattern.

It has been found that using a chemically amplified positive resist composition comprising a compound containing at least two functional groups of the general formula (1) in a molecule, a resist pattern can be formed with the advantages of improved process control and practical utility.

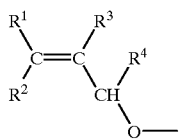

(1)

Herein $R^1$ to $R^4$ are hydrogen or straight, branched or cyclic alkyl groups of 1 to 12 carbon atoms, and a pair of $R^1$ and $R^3$, or a pair of $R^2$ and $R^3$, taken together, may form a ring.

When only a polyhydroxystyrene derivative is formulated in a resist composition as the base resin, there arise such drawbacks as slimming of a pattern film after development with an aqueous base solution and poor dry etching resistance. Even when a copolymer of hydroxystyrene with (meth)acrylate is formulated in a resist composition as the base resin, the above drawbacks are not fully overcome. It has been found that an allyloxy compound having at least two functional groups of formula (1) in a molecule is an effective additive to a chemically amplified positive resist composition, and more specifically, that a chemically amplified positive resist composition comprising the allyloxy compound, a polymer, a photoacid generator and an organic solvent has a high sensitivity, high resolution, dry etching resistance, and process adaptability, and is improved in the slimming of a pattern film after development with an aqueous base solution. The composition is thus well suited for practical use and advantageously used in precise microfabrication, especially in VLSI manufacture. When a vinyloxy compound is added in an analogous way, similar effects are exerted, but accompanied by such drawbacks as a number of foreign particles in the pattern formed and the lack of storage stability. The addition of the allyloxy compound substantially precludes the appearance of such drawbacks.

It has also been found that the allyloxy compound containing at least two functional groups of the formula (1) in a molecule is effective for reducing the flow rate associated with the thermal flow process and that using a chemically amplified positive resist composition comprising the allyloxy compound, a method for forming a contact hole pattern according to the thermal flow process is given the advantages of effective process control and practical utility.

Specifically, making the investigations to be described below, the inventor has established the method of controlling the thermal flow process.

In the inventor's experiment, a variety of base resins commonly used in conventional chemically amplified positive resist compositions were used to form resist films, which were provided with contact holes and subjected to the thermal flow process. The contact hole size was plotted relative to the heating temperature in a graph. It was found that the slope representing a change of contact hole size (to be referred to as a flow rate, hereinafter) was not so different among different base resins. Namely, changing the base resin skeleton gives no substantial difference in the flow rate. The flow rate remains substantially unchanged whether the base resin is a homopolymer or a copolymer and when the molecular weight or dispersity of the base resin is changed. This is also true when the acid labile group and other substituents are changed. The flow rate does not depend on the percent and type of substitution. Blending two or more distinct polymers brings little change of the flow rate. Through these investigations, it was found that only the flow initiation temperature, that is, the temperature at which the contact hole size becomes reduced changes with the base resin and depends on the glass transition temperature (Tg) of the base resin.

A summary of these findings can be illustrated in the graph of FIG. 2. In FIG. 2, curve I denotes a low molecular weight polymer, curve II denotes polymer A, curve III denotes polymer B, curve IV denotes a blend of polymer A and polymer B, curve V denotes a polymer having crosslinking groups, curve VI denotes a high molecular weight polymer, and curve VII denotes a polymer having a high Tg. The gradient of the curve represents the flow rate.

The flow rate can be numerically represented by a change of the contact hole size per degree centigrade of the heating temperature (unit: nm/° C.). While the base resin was changed among a variety of polymers, the flow rate did not substantially change. The change of contact hole size per degree centigrade was approximately 20 nm/° C. In the fabrication of LSI devices of the next generation targeting further miniaturization, the flow rate of 20 nm/° C. is difficult to control, inadequate to process adaptability, and by no means permissible.

Based on the above findings, the inventor made further investigations to find that when a contact hole pattern is formed by the thermal flow process using a chemically amplified positive resist composition comprising a compound containing at least two functional groups of the general formula (1) in a molecule, there are achieved a reduced flow rate, improved process control and practical utility.

By adding a compound containing at least two functional groups of the general formula (1) in a molecule to a chemically amplified positive resist composition, the flow rate in the thermal flow process, that is, the change of contact hole size per degree centigrade of heating temperature is improved as demonstrated in the graph of FIG. 3. In FIG. 3, curve A denotes a composition having the relevant compound added thereto and curve B denotes a control composition (free of the relevant compound).

It is believed that when the compound containing at least two functional groups of the general formula (1) in a molecule is formulated together with a base resin in a chemically amplified positive resist composition, thermal crosslinking reaction can take place between the functional groups and the base resin. It is generally unknown that the functional groups of formula (1), designated allyloxy groups, undergo thermal crosslinking reaction with the base resin in the chemically amplified positive resist composition. Although it is known that compounds having at least two alkenyloxy groups such as vinyloxy, isopropenyloxy and isobutenyloxy groups readily undergo thermal reaction with hydroxyl groups on the base resin in the chemically amplified positive resist composition to form acetal bonds for crosslinking, it is unknown that compounds having functional groups of formula (1) undergo similar reaction. It is considered that the functional groups of formula (1) undergo transition reaction within the resist film to form alkenyloxy groups, thereby incurring similar crosslinking reaction as mentioned above or that the functional groups of formula (1) directly react with benzene rings or polymer chains of the resist base resin to form crosslinks. It has been empirically found that when the compound containing at least two functional groups of formula (1) is added to a chemically amplified positive resist composition, thermal crosslinking reaction proceeds at the heat treating temperature during the thermal flow process, interfering with the rate at which the resist film is fluidized and thereby reducing the flow rate of contact holes. It is also appreciated that the compounds having functional groups of formula (1) are easier to prepare and commercially available at a lower cost than the compounds having alkenyloxy groups such as vinyloxy groups.

After a chemically amplified positive resist composition having added thereto the compound containing at least two functional groups of the general formula (1) in a molecule added thereto was used to form a resist film, which was provided with contact holes and subjected to the thermal flow process, the resulting contact hole pattern configuration was observed. The contact hole pattern was improved in perpendicularity, as compared with a control resist composition (without the compound containing at least two functional groups of formula (1)) yielding a contact hole pattern having rounded sidewalls at the end of thermal flow.

In summary, it has been found that the addition of the compound containing at least two functional groups of the formula (1) is effective for reducing the flow rate associated with the thermal flow process of forming a microsize contact hole pattern and that the composition is effectively controllable and process adaptable in the fabrication of LSI devices of the next generation targeting further miniaturization.

In a first aspect, the invention provides a chemically amplified positive resist composition comprising a compound containing at least two functional groups of the general formula (1) in a molecule.

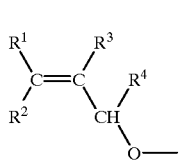

(1)

Herein $R^1$ to $R^4$ are independently hydrogen or straight, branched or cyclic alkyl groups of 1 to 12 carbon atoms, and a pair of $R^1$ and $R^3$, or a pair of $R^2$ and $R^3$, taken together, may form a ring.

Preferably, the compound containing at least two functional groups has the general formula (2).

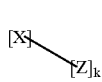

(2)

Herein Z is a functional group of the formula (1), the Z's may be the same or different, k is a positive integer of 2 to 6, and X is a k-valent organic group of 2 to 20 carbon atoms. The compound of the formula (2) is preferably present in an amount of 0.1 to 5% by weight of the overall resist composition.

Typically, the resist composition is used for forming a contact hole pattern by the thermal flow process.

In a second aspect, the invention provides a chemically amplified positive resist composition for forming a contact hole pattern by the thermal flow process, comprising
  (A) an organic solvent,
  (B) a base resin in the form of a polymer having acid labile groups,
  (C) a photoacid generator,
  (D) a basic compound, and
  (E) the compound containing at least two functional groups of the general formula (1) in a molecule.

In one preferred embodiment, the base resin (B) is a polymer comprising recurring units of the following general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in the formula (3). The polymer has a weight average molecular weight of 1,000 to 500,000.

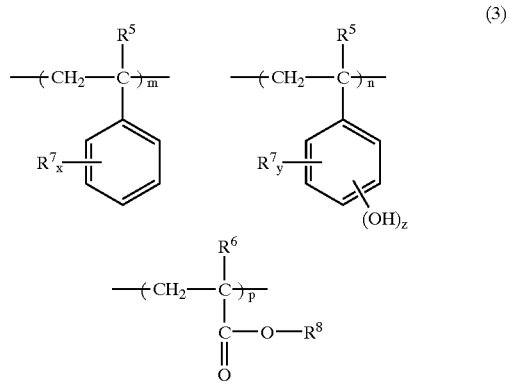

(3)

Herein $R^5$ is hydrogen or methyl, $R^6$ is hydrogen or a methyl, phenyl or cyano group, $R^7$ is a straight, branched or cyclic alkyl group of 1 to 8 carbon atoms, $R^8$ is hydrogen, a straight, branched or cyclic alkyl group of 1 to 20 carbon atoms, or an acid labile group, x and y each are 0 or a positive integer of up to 5, z is an integer satisfying $y+z \leq 5$, m and p are 0 or positive numbers, n is a positive number, satisfying $0 \leq m/(m+n+p) \leq 0.8$, $0 < n/(m+n+p) \leq 1$, and $0 \leq p/(m+n+p) \leq 0.8$.

In a further preferred embodiment, the base resin (B) is a polymer represented by the following general formula (4), that is a polymer comprising recurring units of the general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of

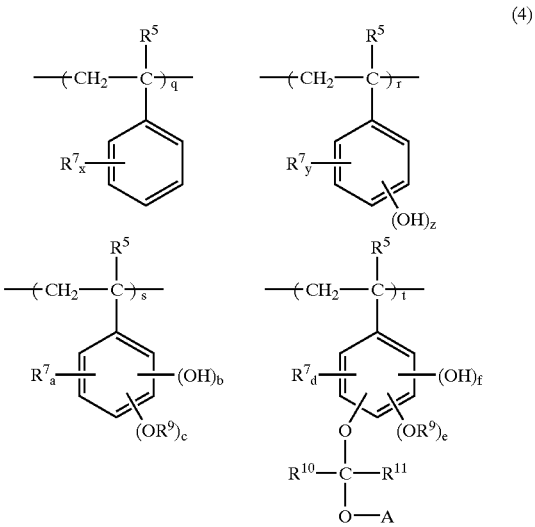

(4)

-continued

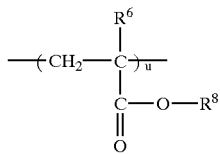

1,000 to 500,000.

A is a group of the following formula (4a).

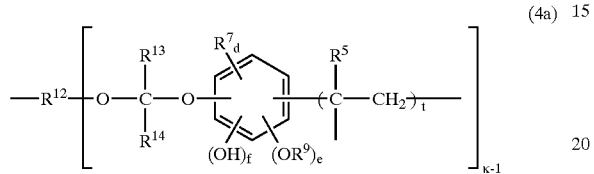

Herein $R^5$ is hydrogen or methyl, $R^6$ is hydrogen or a methyl, phenyl or cyano group, $R^7$ is a straight, branched or cyclic alkyl group of 1 to 8 carbon atoms, $R^8$ is hydrogen, a straight, branched or cyclic alkyl group of 1 to 20 carbon atoms, or an acid labile group, $R^9$ is an acid labile group of at least one type, $R^{10}$, $R^{11}$, $R^{13}$ and $R^{14}$ are independently hydrogen or straight, branched or cyclic alkyl groups of 1 to 6 carbon atoms, $R^{12}$ is a κ-valent aliphatic or alicyclic saturated hydrocarbon, aromatic hydrocarbon or heterocyclic group of 1 to 50 carbon atoms which may be separated by a hetero atom, and in which some hydrogen atoms attached to carbon atoms may be replaced by hydroxyl groups, carboxyl groups, carbonyl groups or halogen atoms, and κ is an integer of 2 to 5, each unit may be constructed of one type or at least two types, x and y each are 0 or a positive integer of up to 5, z is an integer satisfying y+z≦5, a and b are 0 or positive integers, c is a positive integer, satisfying a+b+c≦5, d, e and f are 0 or positive integers satisfying d+e+f≦4, q, s, t and u are 0 or positive numbers, r is a positive number, satisfying 0≦q/(q+r+s+t+u)≦0.8, 0<s/(q+r+s+t+u)≦0.8, 0≦t/(q+r+s+t+u)≦0.8, 0≦u/(q+r+s+t+u)≦0.8, 0<(r+s+t)/(q+r+s+t+u)≦1, and 0<r/(q+r+s+t+u)≦0.8.

In a still further preferred embodiment, the base resin (B) is a polymer represented by the following general formula (5), that is a polymer comprising recurring units of the general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of 1,000 to 500,000.

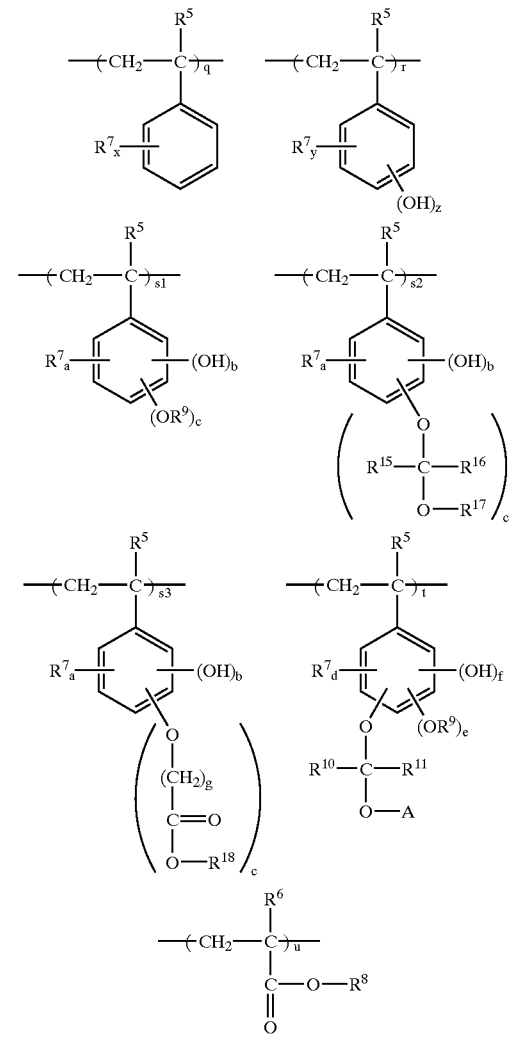

Herein $R^5$, $R^6$, $R^7$, $R^8$, $R^9$, $R^{10}$, $R^{11}$, A, x, y, z, a, b, c, d, e, and f are as defined above, $R^{15}$ and $R^{16}$ are independently hydrogen or straight, branched or cyclic alkyl groups of 1 to 8 carbon atoms, $R^{17}$ is a monovalent hydrocarbon group of 1 to 18 carbon atoms which may have a hetero atom, a pair of $R^{15}$ and $R^{16}$, a pair of $R^{15}$ and $R^{17}$ or a pair of $R^{16}$ and $R^{17}$, taken together, may form a ring, each of $R^{15}$, $R^{16}$ and $R^{17}$ is a straight or branched alkylene group of 1 to 8 carbon atom when they form a ring, $R^{18}$ is a tertiary alkyl group of 4 to 20 carbon atoms, g is 0 or a positive integer of 1 to 6, q, s1, s2, s3, t and u are 0 or positive numbers, r is a positive number, satisfying $0 \leq q/(q+r+s1+s2+s3+t+u) \leq 0.8$, $0 \leq s1/(q+r+s1+s2+s3+t+u) \leq 0.8$, $0 \leq s2/(q+r+s1+s2+s3+t+u) \leq 0.8$, $0 \leq s3/(q+r+s1+s2+s3+t+u) \leq 0.8$, $0 < (s1+s2+s3)/(q+r+s1+s2+s3+t+u) \leq 0.8$, $0 \leq t/(q+r+s1+s2+s3+t+u) \leq 0.8$, $0 \leq u/(q+r+s1+s2+s3+t+u) \leq 0.8$, $0<(r+s1+s2+s3+t)/(q+r+s1+s2+s3+t+u)\leq 1$, and $0<r/(q+r+s1+s2+s3+t+u)\leq 0.8$.

Preferably, component (C) is an onium salt and/or diazomethane derivative, and component (D) is an aliphatic amine.

In a third aspect, the invention provides a method for forming a contact hole pattern, comprising the steps of (i) applying the chemically amplified positive resist composition of any one of claims 4 to 10 onto a substrate to form a coating, (ii) heat treating the coating and exposing the coating to high energy radiation with a wavelength of up to 300 nm or electron beam through a photo-mask, (iii) optionally heat treating the exposed coating, and developing the coating with a developer, thereby forming a contact hole pattern, and (iv) further heat treating the contact hole pattern for reducing the size of contact holes.

In another preferred embodiment, the resist composition of the first aspect further includes as the base resin a polymer comprising recurring units of the following general formula (6) or (7).

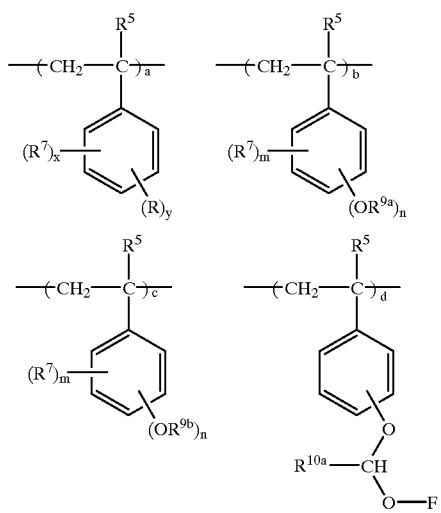

(6)

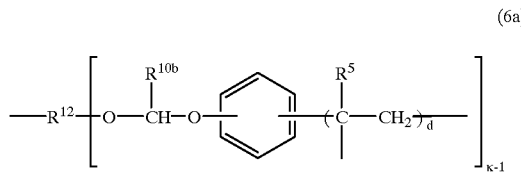

(6a)

F is a group of the following formula (6a).

Herein R is a hydroxyl or $OR^9$ group, $R^5$ is hydrogen or methyl, $R^7$ is a straight, branched or cyclic alkyl group of 1 to 8 carbon atoms, $R^9$, $R^{9a}$ and $R^{9b}$ each are an acid labile group, $R^{10a}$ and $R^{10b}$ each are methyl or ethyl, $R^{12}$ is a κ-valent aliphatic or alicyclic saturated hydrocarbon, aromatic hydrocarbon or heterocyclic group of 1 to 50 carbon atoms which may be separated by a hetero atom, and in which some hydrogen atoms attached to carbon atoms may be replaced by hydroxyl groups, carboxyl groups, carbonyl groups or halogen atoms, and κ is an integer of 2 to 5, x is 0 or a positive integer, y is a positive integer satisfying $x+y\leq 5$, m is 0 or a positive integer, n is a positive integer satisfying $m+n\leq 5$, a, b, c and d are 0 or positive numbers satisfying $a+b+c+d=1$.

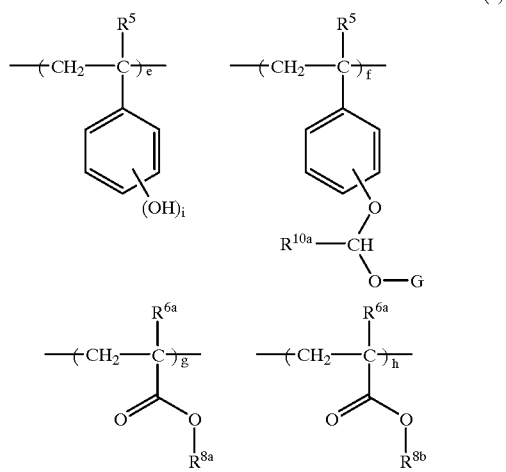

(7)

G is a group of the following formula (7a).

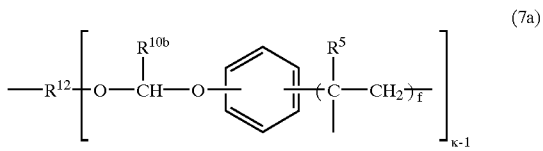

(7a)

Herein $R^5$, $R^{6a}$ and $R^{6b}$ each are hydrogen or methyl, $R^{10a}$ and $R^{10b}$ each are methyl or ethyl, $R^{12}$ is a κ-valent aliphatic or alicyclic saturated hydrocarbon, aromatic hydrocarbon or heterocyclic group of 1 to 50 carbon atoms which may be separated by a hetero atom, and in which some hydrogen atoms attached to carbon atoms may be replaced by hydroxyl groups, carboxyl groups, carbonyl groups or halogen atoms, and κ is an integer of 2 to 5, $R^{8a}$ is a straight, branched or cyclic alkyl group of 1 to 20 carbon atoms which may contain an oxygen or sulfur atom, $R^{8b}$ is a tertiary alkyl group of 4 to 20 carbon atoms, i is a positive integer of up to 5, e, f, g and h each are 0 or a positive number satisfying $e+f+g+h=1$.

In this regard, the invention also provides a chemically amplified positive resist composition comprising (a) an organic solvent, (b) the polymer of formula (6) or (7) as a base resin, (c) a photoacid generator, (d) a basic compound, and (e) the compound of formula (2).

DESCRIPTION OF THE PREFERRED EMBODIMENT

Figure 1:
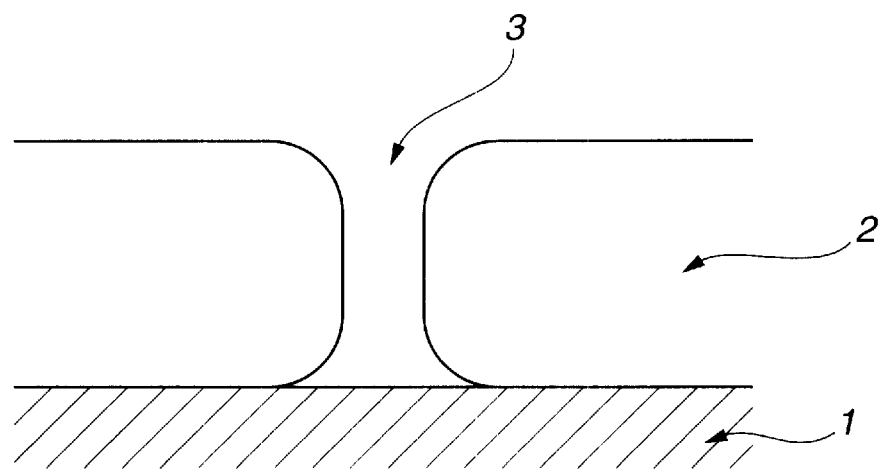
FIG. 1 illustrates in cross section a contact hole having bowed sidewalls after thermal flow.
Figure 2:
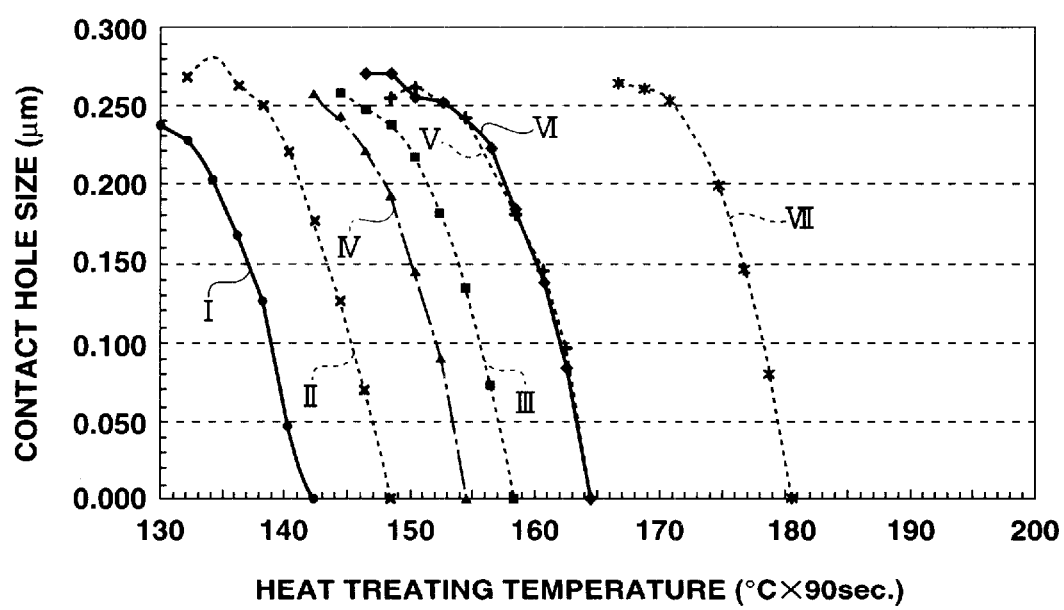
FIG. 2 is a graph showing a contact hole size versus a heating temperature in the thermal flow process.
Figure 3:
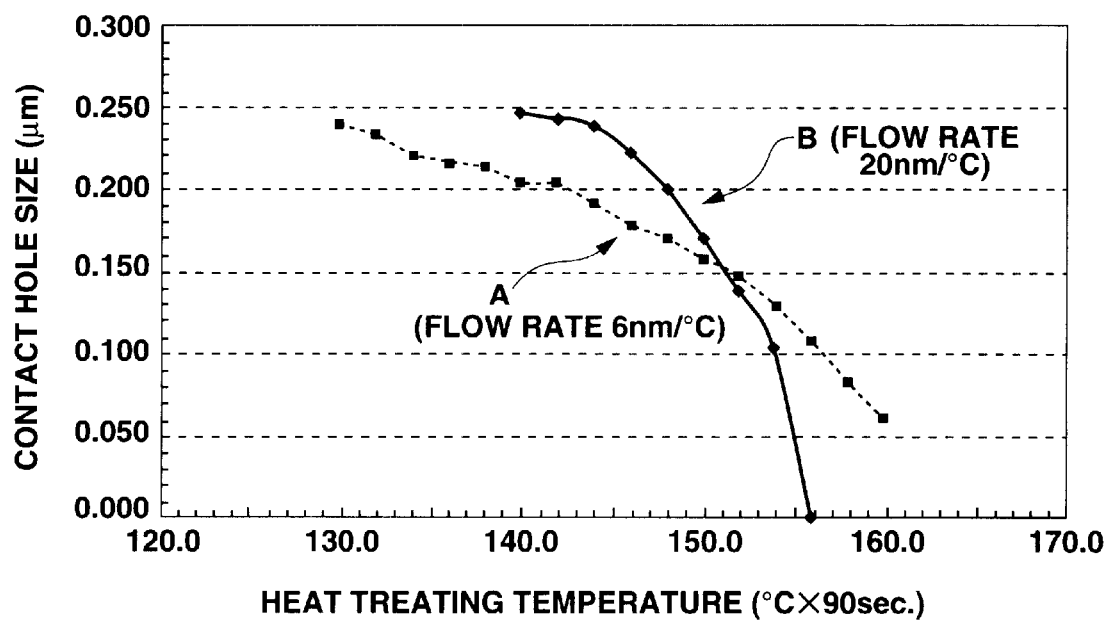
FIG. 3 is a graph showing the thermal flow rate of a resist composition having added thereto a compound having at least two functional groups and a control composition.

The chemical amplification type, positive working resist composition of the invention comprises a compound containing at least two functional groups of the following general formula (1) in a molecule. A compound of the following general formula (2) is preferred.

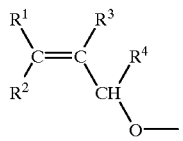

Herein $R^1$ to $R^4$ are independently hydrogen or straight, branched or cyclic alkyl groups of 1 to 12 carbon atoms, and a pair of $R^1$ and $R^3$ or a pair of $R^2$ and $R^3$, taken together, may form a ring having 5 to 20 carbon atoms.

Herein Z is a functional group of formula (1), the Z's may be the same or different, k is a positive integer of 2 to 6, and X is a k-valent organic group of 2 to 20 carbon atoms.

The functional groups of formula (1) are exemplified by allyloxy and groups of the following formulas.

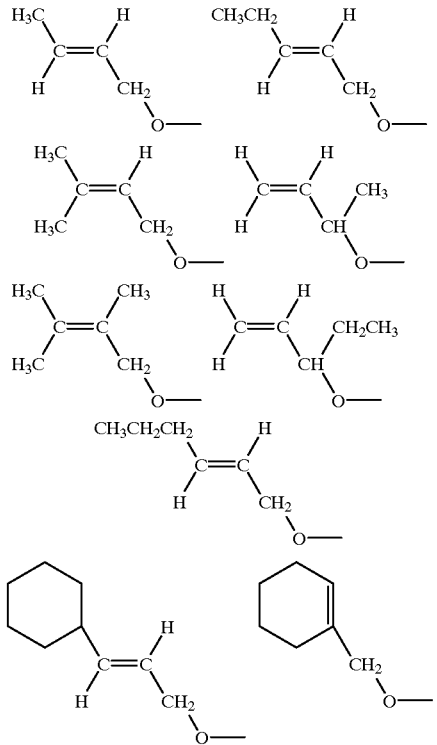

It is understood that these functional groups are readily obtained by effecting reaction of an allyl halide to a compound having at least two hydroxyl groups in its structure (specifically reaction between allyl halide and hydroxyl).

As described above, the structure of the compound containing functional groups of formula (1) is represented by the general formula (2).

Herein X is a k-valent organic group of 2 to 20 carbon atoms. The letter k representative of the number of functional groups is a positive integer of 2 to 6.

More particularly, X is selected from substituted or unsubstituted, aliphatic, alicyclic or aromatic hydrocarbon groups of 2 to 20 carbon atoms, which may be separated by a hetero atom such as oxygen, and substituted ones of the foregoing hydrocarbon groups in which some or all of the hydrogen atoms are replaced by halogen atoms such as F, Cl and Br, hydroxyl groups, alkoxy groups, and the like. X has a valence corresponding to the number of Z groups. Where k=2, for example, X is a substituted or unsubstituted, straight, branched or cyclic alkylene group, arylene group, or aralkylene group, which may be separated by a hetero atom such as oxygen.

The structure of X is exemplified below.

The functional groups which are difunctional are exemplified by ethylene, propylene, isopropylene and the following formulas.

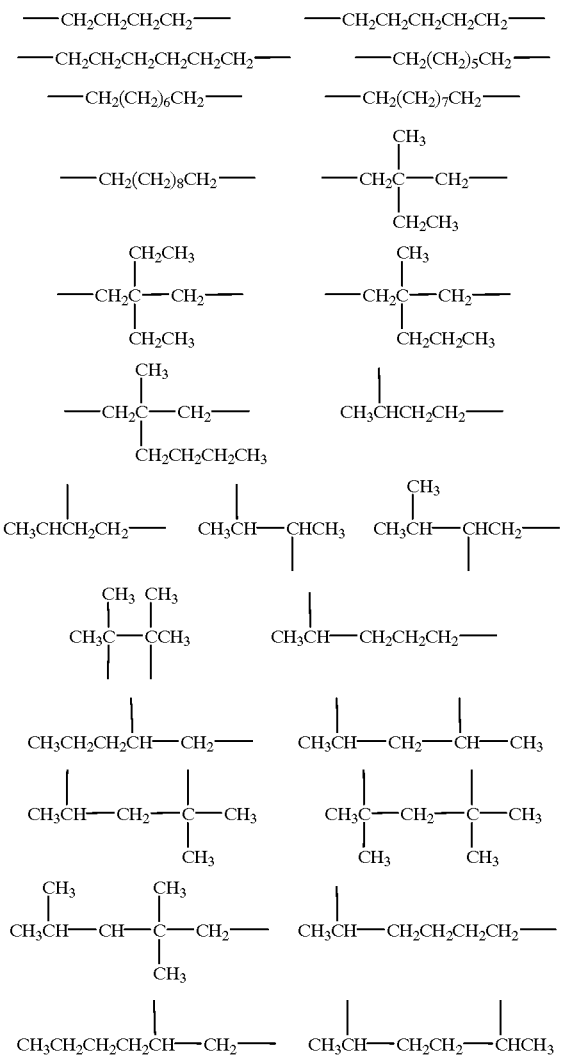

-continued
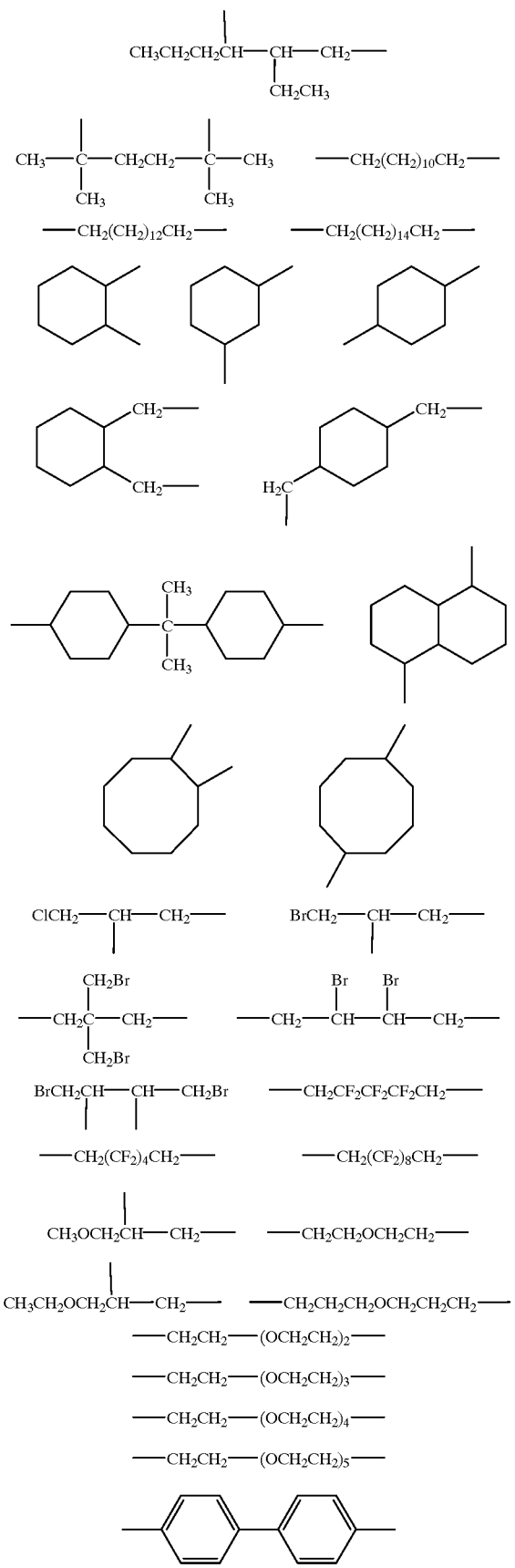
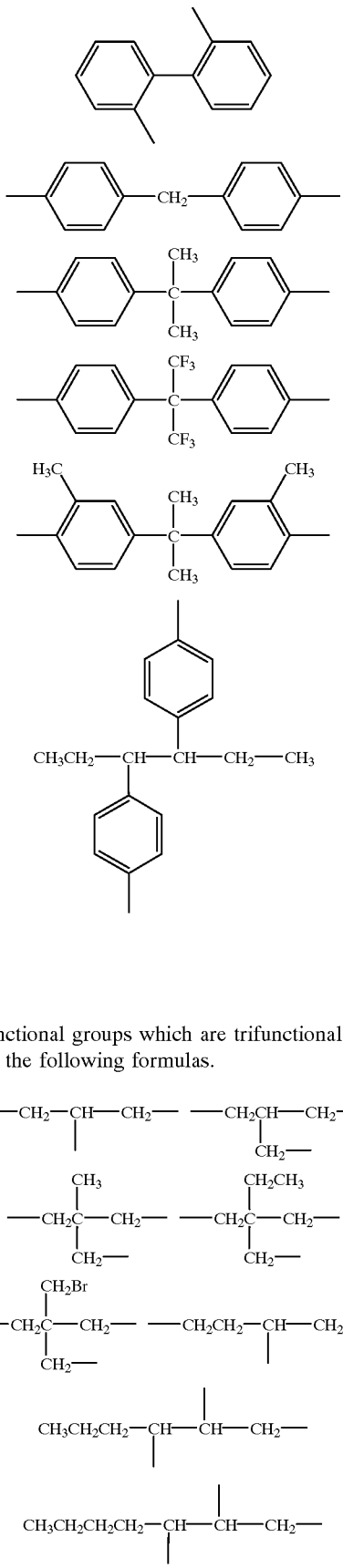
The functional groups which are trifunctional are exemplified by the following formulas.
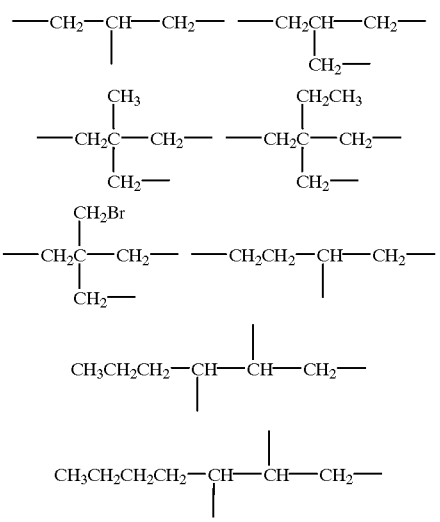

-continued

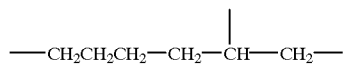

The functional groups which are tetrafunctional are exemplified by the following formulas.

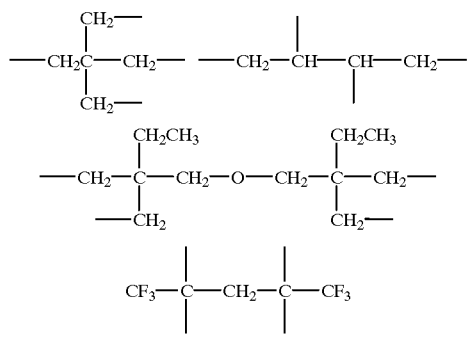

The functional groups which are hexafunctional are exemplified by the following formula.

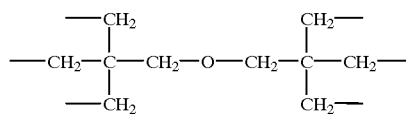

As described above, the allyloxy group is readily obtained by effecting reaction of an allyl halide to a compound having at least two hydroxyl groups in its structure (specifically reaction between allyl halide and hydroxyl). Where the structure is trifunctional or more, all the hydroxyl groups may be reacted. There is a situation where two or more hydroxyl groups are reacted, but hydroxyl groups are left in the structure. The resulting structure is effective because thermal crosslinking reaction can take place.

In the case of tetra or more functionality, the polyhydric alcohols which can be used include the examples described below, and they may be reacted with an allyl halide to form a compound having two or more allyloxy groups. Useful polyhydric alcohols include threitol, adonitol, arabitol, xylitol, sorbitol, mannitol, iditol, dulcitol, fucose, ribose, arabinose, xylose, sorbose, mannose, galactose, glucose, and isomers thereof. All alcohol groups in the polyhydric alcohol compound may be substituted with allyloxy groups. Alternatively, two or more alcohol groups are substituted with allyloxy groups. It is also acceptable that some alcohol groups be substituted with other groups.

Where k in the general formula (2):

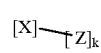

(2)

is a large number, substantial thermal crosslinking reaction takes place during heat treatment of the thermal flow process or during the baking step after coating of the resist composition, leaving a possibility that scum (or insoluble matter) be left on the resist pattern. Where k is a very small number (i.e., k=1), the addition effect is insufficient and thermal crosslinking reaction takes place to a less than desired extent during the thermal flow process so that the flow rate may not be reduced. For this reason, k representative of the number of functional groups in formula (2) is preferably from 2 to 6, and especially from 3 to 4.

Since an aryl type hydrocarbon has a benzene ring or unsaturated cyclic structure, it absorbs deep UV used with chemically amplified positive resist compositions, typically KrF excimer laser light, leaving the risk of reducing the transmittance of the resist. With a lowering of the resist transmittance, the pattern configuration of the resist formed can be exacerbated. For this reason, the structure represented by X favors a saturated hydrocarbon rather than the aryl type hydrocarbon.

Z represents a functional group of the general formula (1) and may be the same or a mixture of different functional groups.

The compound having at least two functional groups of the general formula (1) is preferably added to a chemically amplified positive resist composition in an amount of 0.1 to 5% by weight based on the entire resist composition. Outside the range, a less amount of the compound may exert an insufficient addition effect and be less effective for controlling the thermal flow rate whereas a larger amount of the compound may cause scum generation probably due to abnormal thermal crosslinking and adversely affect the resist sensitivity. A more appropriate amount is 0.5 to 2% by weight of the compound.

On use, the compound having at least two functional groups of the general formula (1) is added to a chemically amplified positive resist composition. Where the compound has a relatively low boiling point, there would arise a problem that if the resist coated on a substrate is held for some time prior to exposure, the compound in the resist coating will volatilize in that duration whereby the sensitivity of pattern formation and the line width of pattern are altered. This problem is generally known as post coating delay and should be avoided in the device fabrication. For this reason, the compound should preferably have a relatively high boiling point so that it will not volatilize during the holding of the resist-coated substrate. Most preferably, the compound has a boiling point in excess of 200° C. under atmospheric pressure.

A chemically amplified positive resist composition comprising the compound having at least two functional groups of the general formula (1) is best suited for forming a contact hole pattern by the thermal flow process. The invention is now described in conjunction with the thermal flow process.

In addition to the compound having at least two functional groups of the general formula (1), the chemically amplified positive resist composition for forming a contact hole pattern according to the invention typically contains:

(A) an organic solvent,
(B) a base resin in the form of a polymer having acid labile groups,
(C) a photoacid generator, and
(D) a basic compound.

(A) Organic Solvent

The organic solvent used herein may be any organic solvent in which the base resin, photoacid generator, dissolution regulator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether, 1-ethoxy-2-propanol and ethyl lactate because the photoacid generator serving as one of the resist components is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

(B) Base Resin

An appropriate base resin used herein is a resin which changes its solubility in an alkaline developer solution under the action of an acid. It is typically, though not limited thereto, an alkali-soluble resin having phenolic hydroxyl and/or carboxyl groups in which some or all of the phenolic hydroxyl and/or carboxyl groups are protected with acid-labile protective groups having C—O—C.

The alkali-soluble resins having phenolic hydroxyl and/or carboxyl groups include homopolymers and copolymers of p-hydroxystyrene, m-hydroxystyrene, α-methyl-p-hydroxystyrene, 4-hydroxy-2-methylstyrene, 4-hydroxy-3-methylstyrene, methacrylic acid and acrylic acid, and such copolymers having a carboxylic derivative or diphenyl ethylene introduced at their terminus.

Also included are copolymers in which units free of alkali-soluble sites such as styrene, α-methylstyrene, acrylate, methacrylate, hydrogenated hydroxystyrene, maleic anhydride and maleimide are introduced in addition to the above-described units in such a proportion that the solubility in an alkaline developer may not be extremely reduced. Substituents on the acrylates and methacrylates may be any of the substituents which do not undergo acidolysis. Exemplary substituents are straight, branched or cyclic $C_{1-8}$ alkyl groups and aromatic groups such as aryl groups, but not limited thereto.

Examples include poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene-α-methyl-p-hydroxystyrene copolymers, p-hydroxystyrene-α-methylstyrene copolymers, p-hydroxystyrene-styrene copolymers, p-hydroxystyrene-m-hydroxystyrene copolymers, p-hydroxystyrene-styrene copolymers, p-hydroxystyrene-acrylic acid copolymers, p-hydroxystyrene-methacrylic acid copolymers, p-hydroxystyrene-methyl methacrylate copolymers, p-hydroxystyrene-acrylic acid-methyl methacrylate copolymers, p-hydroxystyrene-methyl acrylate copolymers, p-hydroxystyrene-methacrylic acid-methyl methacrylate copolymers, poly(methacrylic acid), poly (acrylic acid), acrylic acid-methyl acrylate copolymers, methacrylic acid-methyl methacrylate copolymers, acrylic acid-maleimide copolymers, methacrylic acid-maleimide copolymers, p-hydroxystyrene-acrylic acid-maleimide copolymers, and p-hydroxystyrene-methacrylic acid-maleimide copolymers, but are not limited to these combinations.

Preferred are poly(p-hydroxystyrene), partially hydrogenated p-hydroxystyrene copolymers, p-hydroxystyrene-styrene copolymers, p-hydroxystyrene-acrylic acid copolymers, and p-hydroxystyrene-methacrylic acid copolymers.

The preferred base resin is an alkali-soluble resin comprising recurring units of the following general formula (3). The preferred base resin is a polymer or high molecular weight compound comprising recurring units of the general formula (3) in which some of the hydrogen atoms of the phenolic hydroxyl groups are partially replaced by acid labile groups of at least one type, and/or some of the hydrogen atoms of the remaining phenolic hydroxyl groups are eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in the formula (3). The polymer has a weight average molecular weight of 1,000 to 500,000,

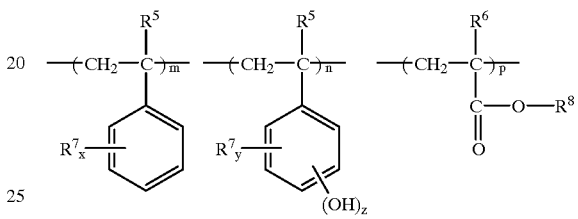

(3)

In formula (3), $R^5$ is hydrogen or methyl, $R^6$ is hydrogen or a methyl, phenyl or cyano group, $R^7$ is a straight, branched or cyclic alkyl group of 1 to 8 carbon atoms, $R^8$ is hydrogen, a straight, branched or cyclic alkyl group of 1 to 20 carbon atoms, or an acid labile group, x and y are 0 or positive integers of up to 5, and z is a positive integer satisfying $y+z \leq 5$, m and p are 0 or positive numbers, n is a positive number, satisfying $0 \leq m/(m+n+p) \leq 0.8$, $0 < n/(m+n+p) \leq 1$, and $0 \leq p/(m+n+p) \leq 0.8$.

The polymer should have a weight average molecular weight (Mw) of 1,000 to 500,000, and especially 3,000 to 100,000. With a Mw of less than 1,000, polymers would perform poorly and often lack heat resistance and film formability. Polymers with a Mw of more than 500,000 would be less soluble in a developer and a resist solvent because of their too high molecular weight. Also the polymer should preferably have a dispersity (Mw/Mn) of up to 3.5, preferably up to 1.5. A dispersity of more than 3.5 often leads to poor resolution.

The preparation method is not critical although poly(p-hydroxystyrene) and similar polymers can be synthesized by living anion polymerization to a low or narrow dispersity.

More preferably, the base resin (B) is a polymer comprising recurring units of the formula (3), that is, a copolymer containing p-hydroxystyrene and/or α-methyl-p-hydroxystyrene and an acrylic acid and/or methacrylic acid in which some hydrogen atoms of phenolic hydroxyl groups are partially replaced by acid labile groups of at least one type, the acrylate and/or methacrylate is an ester protected with an acid labile group, the units of acrylate and methacrylate are contained in the polymer in a proportion of more than 0 mol % to 50 mol % on the average, and the acid labile groups are present in a proportion of more than 0 mol % to 80 mol %, on the average, based on the entire polymer.

This polymer is typically a polymer represented by the following general formula (4), that is a polymer comprising recurring units of the general formula (3) in which some of the hydrogen atoms of the phenolic hydroxyl groups are partially replaced by acid labile groups of at least one type, and/or some of the hydrogen atoms of the remaining phenolic hydroxyl groups are eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of 1,000 to 500,000, (4)

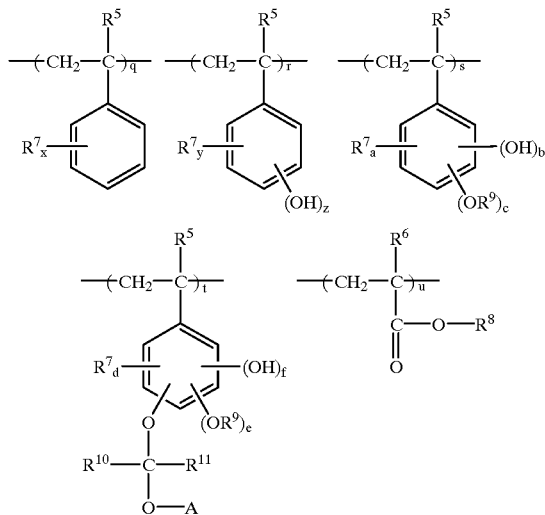

A is a group of the following formula (4a).

(4a)

Herein $R^5$ is hydrogen or methyl, $R^6$ is hydrogen or a methyl, phenyl or cyano group, $R^7$ is a straight, branched or cyclic alkyl group of 1 to 8 carbon atoms, $R^8$ is hydrogen, a straight, branched or cyclic alkyl group of 1 to 20 carbon atoms, or an acid labile group, $R^9$ is an acid labile group of at least one type, $R^{10}$, $R^{11}$, $R^{13}$ and $R^{14}$ are independently hydrogen or straight, branched or cyclic alkyl groups of 1 to 6 carbon atoms, $R^{12}$ is a κ-valent aliphatic or alicyclic saturated hydrocarbon group, aromatic hydrocarbon group or heterocyclic group of 1 to 50 carbon atoms which may be separated by a hetero atom and in which some hydrogen atoms attached to carbon atoms may be replaced by hydroxyl groups, carboxyl groups, carbonyl groups or halogen atoms, and κ is an integer of 2 to 5. Each unit may be constructed of one type or at least two types.

The letters x and y are 0 or positive integers of up to 5, and z is an integer satisfying y+z≦5; a, b and c are 0 or positive integers satisfying a+b+c≦5, with the proviso that c is not equal to 0; d, e and f are 0 or positive integers satisfying d+e+f≦4; q, s, t and u are 0 or positive numbers, r is a positive number, satisfying 0≦q/(q+r+s+t+u)≦0.8, 0<s/(q+r+s+t+u)≦0.8, 0≦t/(q+r+s+t+u)≦0.8, 0≦u/(q+r+s+t+u)≦0.8, 0<(r+s+t)/(q+r+s+t+u)≦1, and 0<r/(q+r+s+t+u)≦0.8.

Illustrative, non-limiting, examples of the straight, branched or cyclic alkyl groups of 1 to 8 carbon atoms include methyl, ethyl, propyl, isopropyl, n-butyl, isobutyl, tert-butyl, cyclohexyl, cyclopentyl, and ethylcyclopentyl.

With respect to the acid labile groups represented by $R^9$, where some phenolic hydroxyl groups on the alkali-soluble resin are protected with acid labile substituents having C—O—C linkages, the acid labile groups are selected from a variety of such groups. The preferred acid labile groups are groups of the following general formulae (8) to (11), tertiary alkyl groups of 4 to 20 carbon atoms, preferably 4 to 15 carbon atoms, trialkylsilyl groups whose alkyl groups each have 1 to 6 carbon atoms, or oxoalkyl groups of 4 to 20 carbon atoms.

(8)

(9)

(10)

(11)

Herein $R^{15}$ and $R^{16}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{17}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

—(CH₂)₄OH   —(CH₂)₂O(CH₂)₃CH₃

—CH₂—⟨cyclohexyl⟩—CH₂OH

—(CH₂)₂O(CH₂)₂OH   —(CH₂)₆OH   ⟨butyrolactone⟩

A pair of $R^{15}$ and $R^{16}$, a pair of $R^{15}$ and $R^{17}$, or a pair of $R^{16}$ and $R^{17}$, taken together, may form a ring. Each of $R^{15}$, $R^{16}$ and $R^{17}$ is a straight or branched alkylene group of 1 to 18 carbon atoms, preferably 1 to 10 carbon atoms, when they form a ring.

$R^{18}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (8). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxoran-4-yl. Letter z is an integer of 0 to 6.

$R^{19}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl and cyclohexylethyl. Exemplary substituted or unsubstituted aryl groups include phenyl, methylphenyl, naphthyl, anthryl, phenanthryl, and pyrenyl. Letter h is equal to 0 or 1, i is equal to 0, 1, 2 or 3, satisfying 2h+i=2 or 3.

$R^{20}$ is a straight, branched or cyclic alkyl group of 1 to 8 carbon atoms or substituted or unsubstituted aryl group of 6 to 20 carbon atoms, examples of which are as exemplified for $R^{19}$. $R^{21}$ to $R^{30}$ are independently hydrogen or monovalent hydrocarbon groups of 1 to 15 carbon atoms which may contain a hetero atom, for example, straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, and sulfo groups. $R^{21}$ to $R^{30}$, for example, a pair of $R^{21}$ and $R^{22}$, a pair of $R^{21}$ and $R^{23}$, a pair of $R^{22}$ and $R^{24}$, a pair of $R^{23}$ and $R^{24}$, a pair of $R^{25}$ and $R^{26}$, or a pair of $R^{27}$ and $R^{28}$, taken together, may form a ring. When $R^{21}$ to $R^{30}$ form a ring, they are divalent $C_1$–$C_{15}$ hydrocarbon groups which may contain a hetero atom, examples of which are the above-exemplified monovalent hydrocarbon groups with one hydrogen atom eliminated. Also, two of $R^{21}$ to $R^{30}$ which are attached to adjacent carbon atoms (for example, a pair of $R^{21}$ and $R^{23}$, a pair of $R^{23}$ and $R^{29}$, or a pair of $R^{27}$ and $R^{29}$) may directly bond together to form a double bond.

Of the acid labile groups of formula (8), illustrative examples of the straight or branched groups are given below.

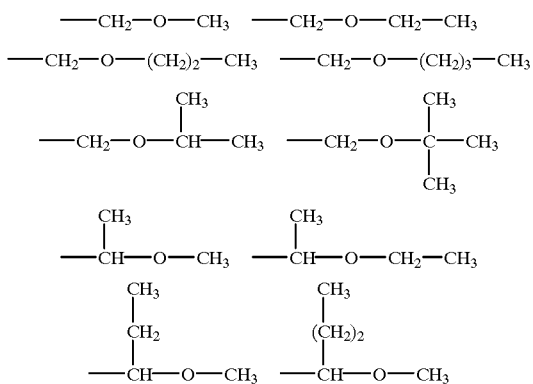

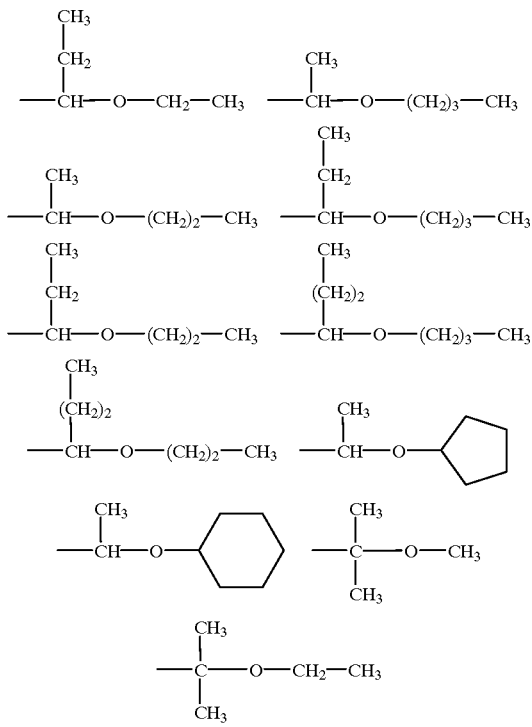

Of the acid labile groups of formula (8), illustrative examples of the cyclic groups include tetrahydrofuran-2-yl, 2-methyltetrahydrofuran-2-yl, tetrahydropyran-2-yl and 2-methyltetrahydropyran-2-yl.

Illustrative examples of the acid labile groups of formula (9) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Illustrative examples of the acid labile groups of formula (10) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Illustrative examples of the acid labile groups of formula (11) are given below.

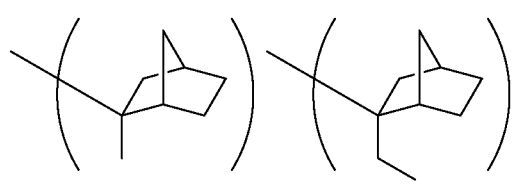

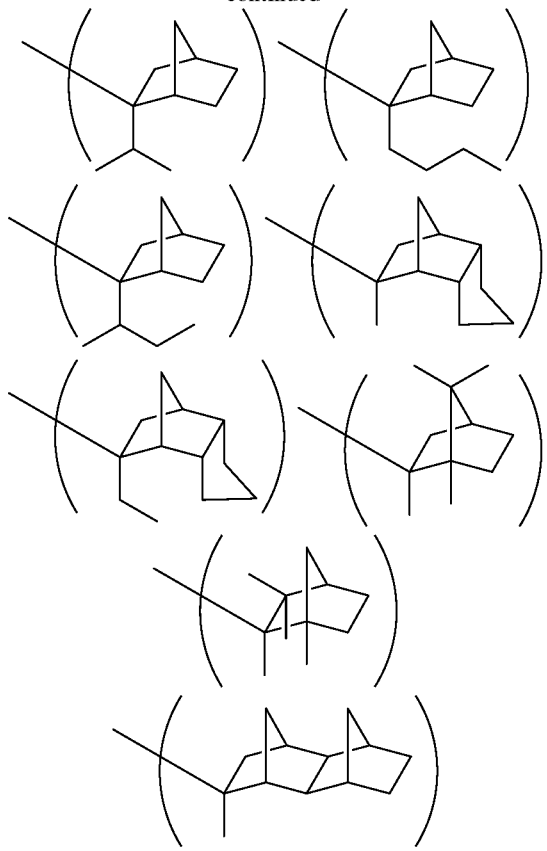

Exemplary of the tertiary alkyl group of 4 to 20 carbon atoms, preferably 4 to 15 carbon atoms, are tert-butyl, tert-amyl, 3-ethyl-3-pentyl and dimethylbenzyl.

Exemplary of the trialkylsilyl groups whose alkyl groups each have 1 to 6 carbon atoms are trimethylsilyl, triethylsilyl, and tert-butyldimethylsilyl.

Exemplary of the oxoalkyl groups of 4 to 20 carbon atoms are 3-oxocyclohexyl and groups represented by the following formulae.

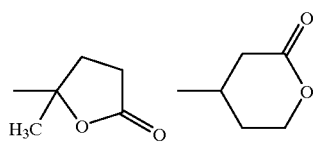

Also the base resin (B) may be a polymer comprising units of formula (3) in which some of the hydrogen atoms of the phenolic hydroxyl groups are partially replaced by acid labile groups of one or more types, and the hydrogen atoms of the remaining phenolic hydroxyl groups are crosslinked within a molecule and/or between molecules, in a proportion of more than 0 mol % to 80 mol %, on the average, of the entire phenolic hydroxyl groups on the polymer of formula (3), with crosslinking groups having C—O—C linkages represented by the following general formula (12).

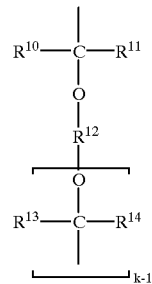

(12)

Herein, $R^{10}$, $R^{11}$, $R^{13}$ and $R^{14}$ are independently hydrogen or straight, branched or cyclic alkyl groups of 1 to 6 carbon atoms, examples of which are the same as exemplified for $R^7$.

$R^{12}$ is a κ-valent aliphatic or alicyclic saturated hydrocarbon, aromatic hydrocarbon or heterocyclic group of 1 to 50 carbon atoms, which may be separated by a hetero atom, and in which some hydrogen atoms attached to carbon atoms may be replaced by hydroxyl groups, carboxyl groups, carbonyl groups or halogen atoms, and κ is an integer of 2 to 5.

Examples of the k-valent hydrocarbon groups represented by $R^{12}$ include substituted or unsubstituted alkylene groups of 1 to 50 carbon atoms, and preferably 1 to 40 carbon atoms, which may have an intervening heteroatom such as O, NH, N(CH$_3$), S, or SO$_2$, and which may be substituted with hydroxyl, carboxyl, acyl or fluorine; arylene groups of 6 to 50 carbon atoms, and preferably 6 to 40 carbon atoms; combinations of these alkylene groups with these arylene groups; and tri to penta-valent groups obtained by removing hydrogen atoms attached to carbon atoms in any of the foregoing groups. Additional examples include di to penta-valent heterocyclic groups, and combinations of these heterocyclic groups with the above hydrocarbon groups. Preferably, $R^{12}$ stands for straight, branched or cyclic alkyl groups of 1 to 10 carbon atoms, alkyl ether, cyclohexyl, and aryl groups (these preferred $R^{12}$ groups are designated $R^{12a}$, hereinafter).

Illustrative examples of $R^{12}$ in formula (12) are given below.

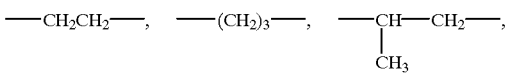

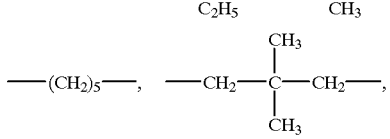

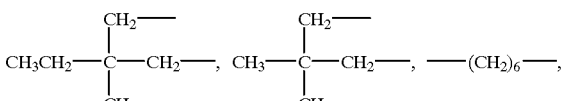

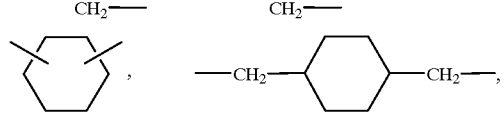

-continued

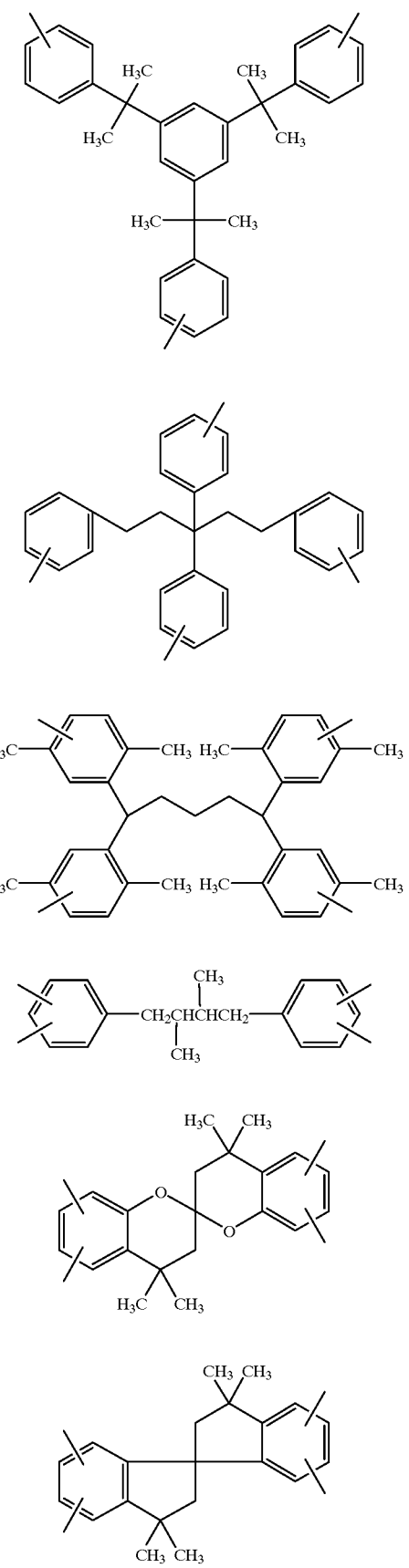

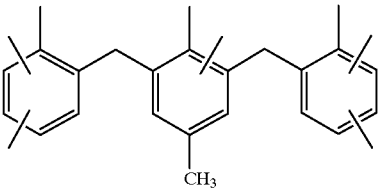

These crosslinking groups having C—O—C linkages within and/or between molecules are readily obtainable by reacting phenolic hydroxyl groups with alkenyl ether compounds or halogenated alkyl ether compounds.

Where the base resin in the resist composition according to the invention is crosslinked with acid labile substituents, it is a polymer which is obtained by reacting phenolic hydroxyl groups with an alkenyl ether compound or halogenated alkyl ether such that the polymer is crosslinked within a molecular and/or between molecules with crosslinking groups having C—O—C linkages, wherein the total amount of the acid labile groups and crosslinking groups is preferably, on the average, more than 0 mol % to 80 mol %, especially 2 to 50 mol %, based on the entire phenolic hydroxyl groups in formula (3).

An appropriate proportion of crosslinking groups having C—O—C linkages is, on the average, from more than 0 mol % to 50 mol %, and especially from 0.2 to 20 mol %. With 0 mol %, few benefits of the crosslinking group are obtained, resulting in a reduced contrast of alkali dissolution rate and a low resolution. With more than 50 mol %, a too much crosslinked polymer would gel, become insoluble in alkali, induce a film thickness change, internal stresses or bubbles upon alkali development, and lose adhesion to the substrate due to less hydrophilic groups.

The proportion of acid labile groups is on the average preferably from more than 0 mol % to 80 mol %, especially from 10 to 50 mol %. With 0 mol %, there may result a reduced contrast of alkali dissolution rate and a low resolution. With more than 80 mol %, there may result a loss of alkali dissolution, less affinity to an alkali developer upon development, and a low resolution.

By properly selecting the proportions of crosslinking groups having C—O—C linkages and acid labile groups within the above-defined ranges, it becomes possible to control the size and configuration of a resist pattern as desired. The contents of crosslinking groups having C—O—C linkages and acid labile groups in the polymer have substantial influence on the dissolution rate contrast of a resist film and govern the properties of the resist composition relating to the size and configuration of a resist pattern.

In the resist composition, the preferred acid labile groups introduced in the base resin (B) are 1-ethoxycyclopentyl, 1-ethoxycyclohexylcarbonylmethyl, tert-amyl, 1-ethoxyethyl, 1-ethoxypropyl, tetrahydrofuranyl, tetrahydropyranyl, tert-butyl, 1-ethylcyclohexyl, tert-butoxycarbonyl, tert-butoxycarbonylmethyl groups, and substituents of formula (12) wherein $R^{10}$ and $R^{13}$ are methyl, $R^{11}$ and $R^{14}$ are hydrogen, and $R^{12}$ is ethylene, 1,4-butylene or 1,4-cyclohexylene.

In a single polymer, these substituents may be incorporated alone or in admixture of two or more types. A blend of two or more polymers having substituents of different types is also acceptable.

Appropriate combinations of substituents of two or more types include a combination of acetal with acetal analog, a combination of acetal with a substituent having a different degree of scission by acid such as tert-butoxy, a combination of a crosslinking acid labile group with acetal, and a combination of a crosslinking acid labile group with a substituent having a different degree of scission by acid such as tert-butoxy.

The percent proportion of these substituents substituting for phenol and carboxyl groups in the polymer is not critical. Preferably the percent substitution is selected such that when a resist composition comprising the polymer is applied onto a substrate to form a coating, the unexposed area of the coating may have a dissolution rate of 0.01 to 10 Å/sec in a 2.38% tetramethylammonium hydroxide (TMAH) developer.

On use of a polymer containing a greater proportion of carboxyl groups which can reduce the alkali dissolution rate, the percent substitution must be increased or non-acid-labile substituents to be described later must be introduced.

When acid labile groups for intramolecular and/or intermolecular crosslinking are to be introduced, the percent proportion of crosslinking substituents is preferably up to 20 mol %, more preferably up to 10 mol %. If the percent substitution of crosslinking substituents is too high, crosslinking results in a higher molecular weight which can adversely affect dissolution, stability and resolution. It is also preferred to further introduce another non-crosslinking acid labile group into the crosslinked polymer at a percent substitution of up to 10 mol % for adjusting the dissolution rate to fall within the above range.

In the case of poly(p-hydroxystyrene), the optimum percent substitution differs between a substituent having a strong dissolution inhibitory action such as a tert-butoxycarbonyl group and a substituent having a weak dissolution inhibitory action such as an acetal group although the overall percent substitution is preferably 10 to 40 mol %, more preferably 20 to 30 mol %.

Polymers having such acid labile groups introduced therein should preferably have a weight average molecular weight (Mw) of 1,000 to 500,000. With a Mw of less than 1,000, polymers would perform poorly and often lack heat resistance and film formability. Polymers with a Mw of more than 500,000 would be less soluble in a developer and a resist solvent.

Where non-crosslinking acid labile groups are introduced, the polymer should preferably have a dispersity (Mw/Mn) of up to 3.5, preferably up to 1.5. A polymer with a dispersity of more than 3.5 often results in a low resolution. Where crosslinking acid labile groups are introduced, the starting alkali-soluble resin should preferably have a dispersity (Mw/Mn) of up to 1.5, and the dispersity is preferably kept at 3 or lower even after protection with crosslinking acid labile groups. If the dispersity is higher than 3, dissolution, coating, storage stability and/or resolution is often poor.

To impart a certain function, suitable substituent groups may be introduced into some of the phenolic hydroxyl and carboxyl groups on the acid labile group-protected polymer. Exemplary are substituent groups for improving adhesion to the substrate, non-acid-labile groups for adjusting dissolution in an alkali developer, and substituent groups for improving etching resistance. Illustrative, non-limiting, substituent groups include 2-hydroxyethyl, 2-hydroxypropyl, methoxymethyl, methoxycarbonyl, ethoxycarbonyl, methoxycarbonylmethyl, ethoxycarbonylmethyl, 4-methyl-2-oxo-4-oxoranyl, 4-methyl-2-oxo-4-oxanyl, methyl, ethyl, propyl, n-butyl, sec-butyl, acetyl, pivaloyl, adamantyl, isobornyl, and cyclohexyl.

In a further illustrative and preferred embodiment, the base resin (B) is a polymer represented by the following general formula (5), especially (5'), that is a polymer comprising recurring units of the general formula (3) in which some of the hydrogen atoms of the phenolic hydroxyl groups are partially replaced by acid labile groups of at least one type, and/or some of the hydrogen atoms of the remaining phenolic hydroxyl groups are eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of 1,000 to 500,000.

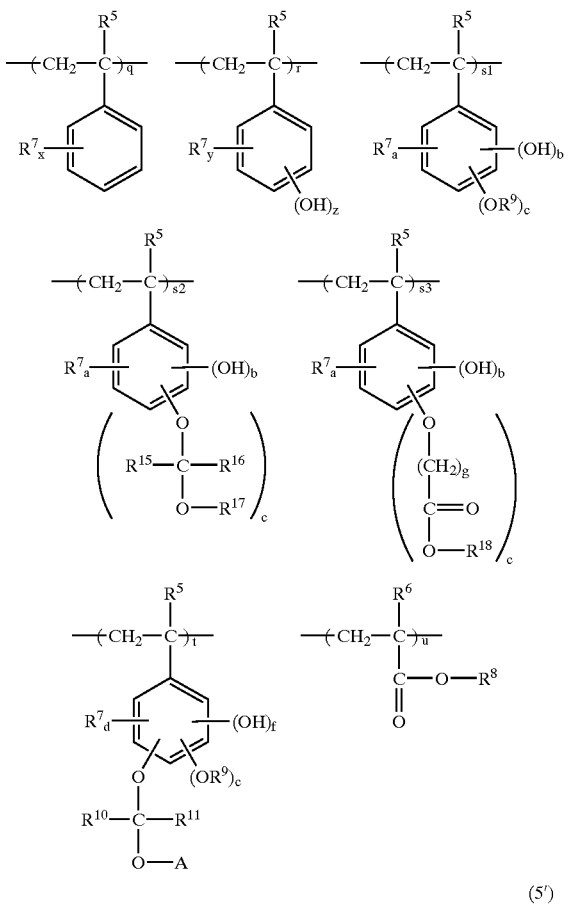

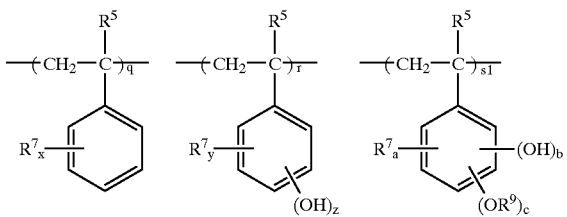

-continued

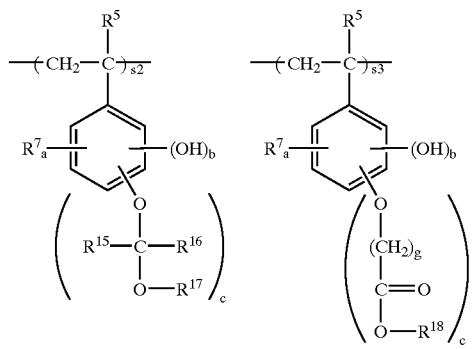

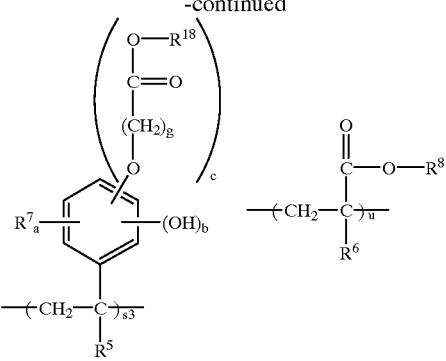

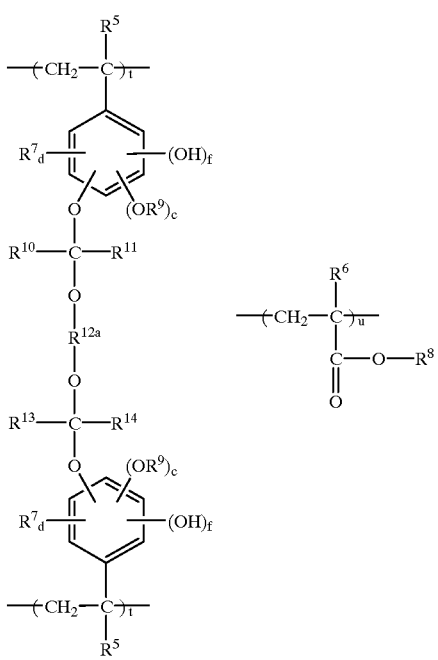

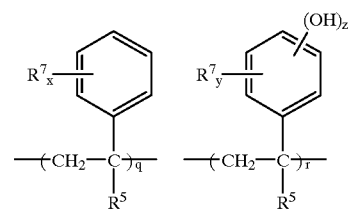

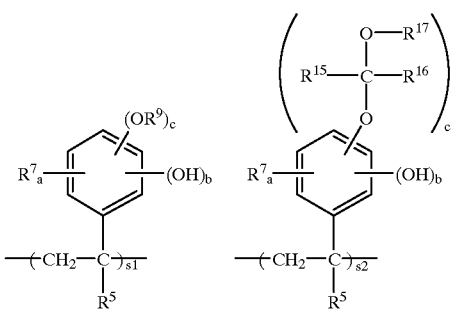

Herein $R^5$, $R^6$, $R^7$, $R^8$, $R^9$, $R^{10}$, $R^{11}$, A, $R^{12a}$, x, y, z, a, b, c, d, e, and f are as defined above.

$R^{15}$ and $R^{16}$ are independently hydrogen or straight, branched or cyclic alkyl groups of 1 to 8 carbon atoms, $R^{17}$ is a monovalent hydrocarbon group of 1 to 18 carbon atoms which may have a hetero atom, a pair of $R^{15}$ and $R^{16}$, a pair of $R^{15}$ and $R^{17}$ or a pair of $R^{16}$ and $R^{17}$, taken together, may form a ring, each of $R^{15}$, $R^{16}$ and $R^{17}$ is a straight or branched alkylene group of 1 to 8 carbon atom when they form a ring, and $R^{18}$ is a tertiary alkyl group of 4 to 20 carbon atoms.

The letter g is 0 or a positive integer of 1 to 6, q, s1, s2, s3, t and u are 0 or positive numbers, r is a positive number, satisfying $$0 \leq q/(q+r+s1+s2+s3+t+u) \leq 0.8,$$

$$0 \leq s1/(q+r+s1+s2+s3+t+u) \leq 0.8,$$

$$0 \leq s2/(q+r+s1+s2+s3+t+u) \leq 0.8,$$

$$0 \leq s3/(q+r+s1+s2+s3+t+u) \leq 0.8,$$

$$0 < (s1+s2+s3)/(q+r+s1+s2+s3+t+u) \leq 0.8,$$

$$0 \leq t/(q+r+s1+s2+s3+t+u) \leq 0.8,$$

$$0 \leq u/(q+r+s1+s2+s3+t+u) \leq 0.8,$$

$$0 < (r+s1+s2+s3+t)/(q+r+s1+s2+s3+t+u) \leq 1, \text{ and}$$

$$0 < r/(q+r+s1+s2+s3+t+u) \leq 0.8.$$

(C) Photoacid Generator

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris (p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

β-ketosulfone derivatives such as 2-cyclohexylcarbonyl-2-(p-toluenesulfonyl)propane and 2-isopropylcarbonyl-2-(p-toluenesulfonyl)propane;

diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; and diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane. These photoacid generators may be used singly or in combinations of two or more thereof. Onium salts are effective for improving rectangularity, while diazomethane derivatives are effective for reducing standing waves. The combination of an onium salt with a diazomethane allows for fine adjustment of the profile.

The photoacid generator is preferably added in an amount of about 0.5 to 15 parts by weight, and especially about 1 to 8 parts by weight, per 100 parts by weight of all the base resins. At less than 0.5 part, the sensitivity would be poor. The addition of more than 15 parts would lower the alkali dissolution rate, resulting in a poor resolution, and the resist becomes less heat resistant because of an increased content of monomer components.

(D) Basic Compound

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives, with the aliphatic amines being preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4- phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethyl-ethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide. Of these, triethylamine, N,N-dimethylaniline, N-methylpyrrolidone, pyridine, quinoline, nicotinic acid, triethanolamine, piperidine ethanol, N,N-dimethylacetamide and succinimide are preferred.

Also useful are substituted ones of the hydroxyl group-bearing nitrogenous compounds in which some or all of the hydrogen atoms of hydroxyl groups are replaced by methyl, ethyl, methoxymethyl, methoxyethoxymethyl, acetyl, or ethoxyethyl groups. Preferred are methyl-, acetyl-, methoxymethyl- and methoxyethoxymethyl-substituted compounds of ethanolamine, diethanolamine and triethanolamine. Examples include tris(2-methoxyethyl)amine, tris(2-ethoxyethyl)amine, tris(2-acetoxyethyl)amine, tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{(2-hydroxyethoxy)ethoxy}ethyl]amine.

The basic compounds may be used alone or in admixture of two or more. The basic compound is preferably formulated in an amount of 0.01 to 2 parts, and especially 0.01 to 1 part by weight, per 100 parts by weight of the base resin. Less than 0.01 part of the basic compound fails to achieve the desired effects thereof, while the use of more than 2 parts would result in too low a sensitivity.

Other Components

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, and fluorinated organosiloxane compounds. Useful surfactants are commercially available under the trade names Florade FC-430 and FC-431 from Sumitomo 3M K.K., Surflon S-141 and S-145 from Asahi Glass K.K., Unidine DS-401, DS-403 and DS-451 from Daikin Industry K.K., Megaface F-8151 from Dai-Nippon Ink & Chemicals K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

In forming a contact hole pattern using the chemically amplified positive resist composition of the invention, a known lithographic technique may be used. For example, the resist composition is applied onto a substrate such as a silicon wafer by spin coating or the like to form a resist film having a thickness of 0.5 to 2.0 $\mu$m, which is then pre-baked on a hot plate at 60 to 150° C. for 1 to 10 minutes, and preferably at 80 to 120° C. for 1 to 5 minutes. A patterning mask having the desired contact hole pattern is then placed over the resist film, and the film exposed through the mask to an electron beam or to high-energy radiation with a wavelength of up to 300 nm such as deep-UV rays, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 1 to 5 minutes, and preferably at 80 to 120° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate.

Then the contact hole pattern film was subjected to thermal flow by heating on a hot plate. The heating temperature is preferably 100 to 200° C., and especially 100 to 150° C. when a precision of hot plate heating is taken into account. The heating time is preferably 60 to 120 seconds.

The contact holes have a size of 0.20 to 0.30 $\mu$m at the end of exposure and development. By the thermal flow process, the contact holes are contracted to a size of 0.10 to 0.15 $\mu$m. The thermal flow process enables to form a miniature contact hole pattern.

Of the various types of high-energy radiation that may be used, the resist composition of the invention is best suited to fine pattern formation with, in particular, deep-UV rays having a wavelength of 254 to 193 nm, an excimer laser, x-rays, or an electron beam.

Other Embodiments

Without being limited to the formation of a contact hole pattern by the thermal flow process, the chemically amplified, positive resist composition of the invention is also advantageously used as a resist material relying on the conventional well-known lithography.

Any desired polymer may be used as the base resin in the chemically amplified, positive resist composition not relying on the contact hole pattern formation. The preferred base resin is a polymer or high molecular weight compound comprising recurring units of the following general formula (6) or (7).

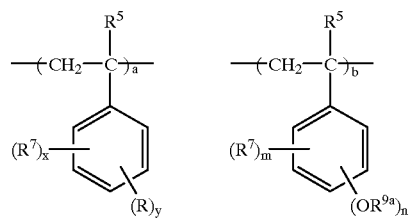

(6)

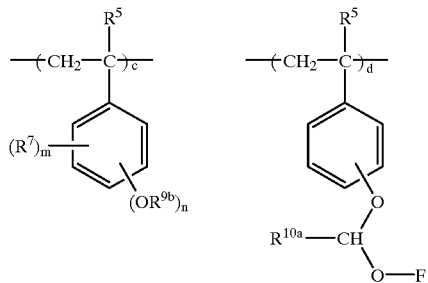

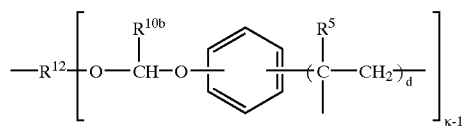

Herein F is a group of the following formula (6a).

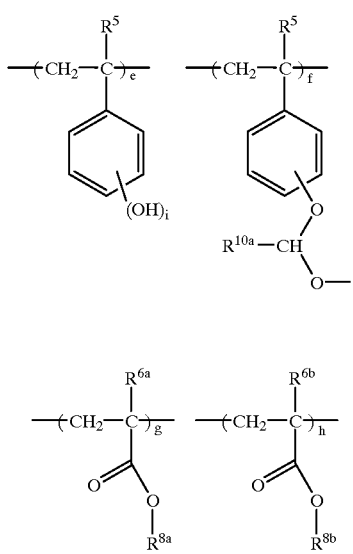

(6a)

Herein R is a hydroxyl or $OR^9$ group, $R^5$ is hydrogen or methyl, $R^7$ is a straight, branched or cyclic alkyl group of 1 to 8 carbon atoms, $R^9$, $R^{9a}$ and $R^{9b}$ each are an acid labile group, $R^{10a}$ and $R^{10b}$ each are methyl or ethyl, $R^{12}$ is a κ-valent aliphatic or alicyclic saturated hydrocarbon, aromatic hydrocarbon or heterocyclic group of 1 to 50 carbon atoms, which may be separated by a hetero atom, and in which some hydrogen atoms attached to carbon atoms may be replaced by hydroxyl groups, carboxyl groups, carbonyl groups or halogen atoms, and κ is an integer of 2 to 5, x is 0 or a positive integer, y is a positive integer satisfying x+y≦5, m is 0 or a positive integer, n is a positive integer satisfying m+n≦5, a, b, c and d are 0 or positive numbers satisfying a+b+c+d=1.

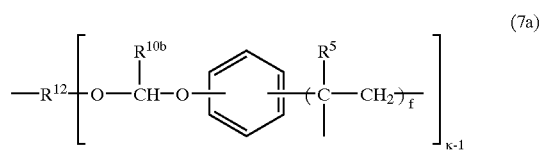

Herein G is a group of the following formula (7a).

(7a)

Herein $R^5$, $R^{6a}$ and $R^{6b}$ each are hydrogen or methyl, $R^{10a}$ and $R^{10b}$ each are methyl or ethyl, $R^{12}$ is a κ-valent aliphatic or alicyclic saturated hydrocarbon, aromatic hydrocarbon or heterocyclic group of 1 to 50 carbon atoms, which may be separated by a hetero atom, and in which some hydrogen atoms attached to carbon atoms may be replaced by hydroxyl groups, carboxyl groups, carbonyl groups or halogen atoms, and κ is an integer of 2 to 5, $R^{8a}$ is a straight, branched or cyclic alkyl group of 1 to 20 carbon atoms which may contain an oxygen or sulfur atom, $R^{8b}$ is a tertiary alkyl group of 4 to 20 carbon atoms, i is a positive integer of up to 5, e, f, g and h each are 0 or a positive number satisfying e+f+g+h=1.

Illustrative examples of $R^{12}$ are as previously described. More preferably, $R^{12}$ stands for straight, branched or cyclic alkylene groups of 1 to 10 carbon atoms. In this respect, the polymers of formulas (6) and (7) are preferably represented by the following formulas (6') and (7'), respectively.

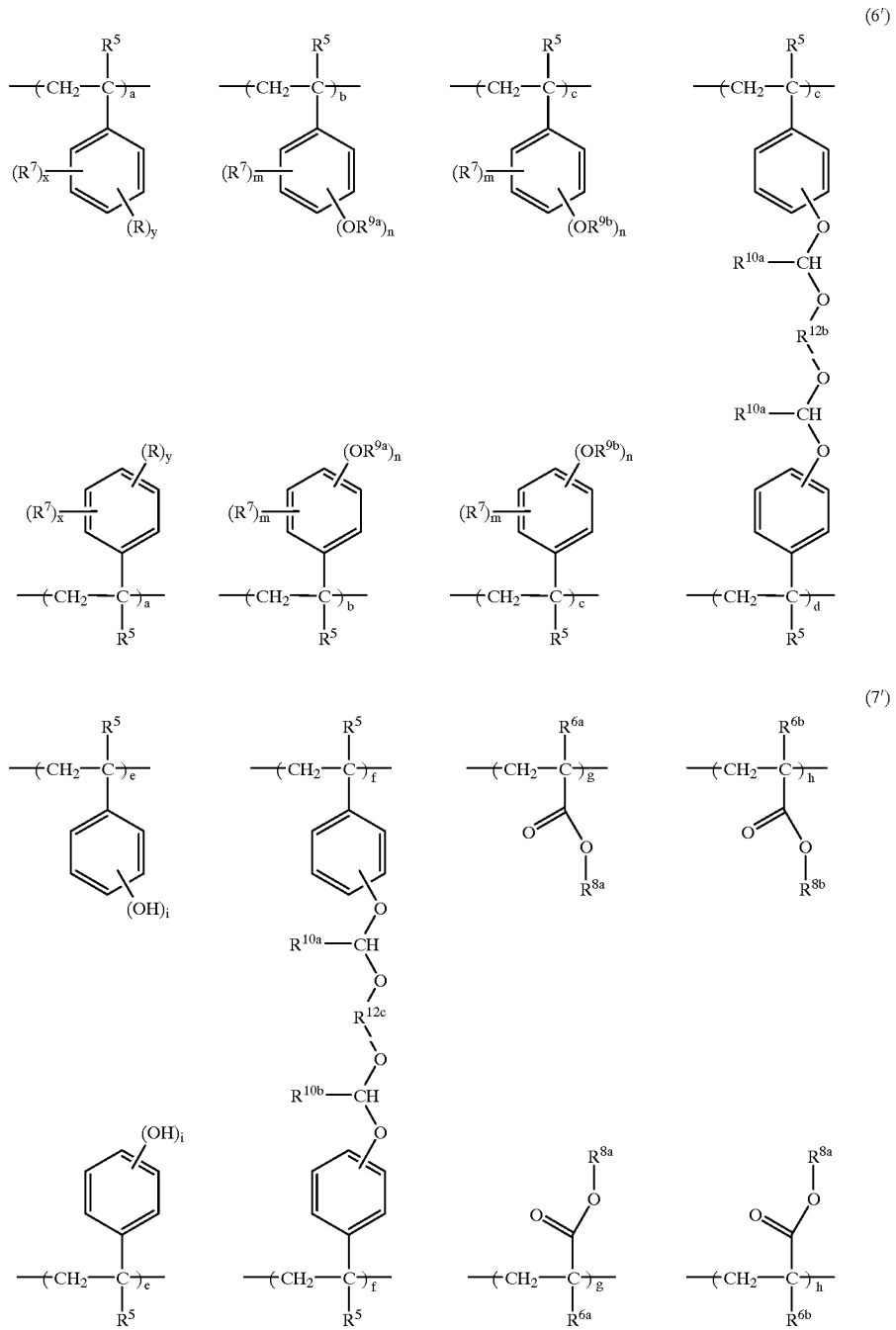

R$^{12b}$ and R$^{12c}$ each are a straight, branched or cyclic alkylene group of 1 to 10 carbon atoms.

R$^{9a}$ and R$^{9b}$ stand for different acid labile groups. The acid labile groups represented by R$^{9a}$ and R$^{9b}$ are as illustrated above for R$^9$. Preferably, the acid labile groups represented by R$^{9a}$ and R$^{9b}$ are of formulas (8) and (9).

The alkyl groups represented by R$^{8a}$ include a variety of such groups, for example, cyclohexyl, cyclopentyl, norbornyl, isobornyl, 5-membered ring lactone, 6-membered ring lactone, and tetrahydrofuran groups as well as alkyl groups substituted with a carbonate, dioxoran, hydroxyethyl, and methoxymethyl group, though not limited thereto.

The tertiary alkyl group represented by R$^{8b}$ is selected from a variety of such groups, preferably from among the groups of the following formulas (13) and (14).

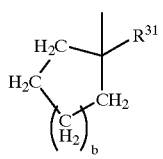

(13)

Herein, $R^{31}$ is a methyl, ethyl, isopropyl, cyclohexyl, cyclopentyl, vinyl, acetyl, phenyl or cyano group. Letter b is an integer of 0 to 3.

The cyclic alkyl groups of formula (13) are preferably 5-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

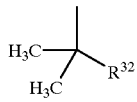

(14)

Herein, $R^{32}$ is an isopropyl, cyclohexyl, cyclopentyl, vinyl, acetyl, phenyl or cyano group.

Examples of the group of formula (14) include 1-vinyldimethyl, 1-acetyldimethyl, 1-phenyldimethyl and 1-cyanodimethyl.

In formula (6), a, b, c and d are 0 or positive numbers providing the total a+b+c+d=1, and they preferably satisfy the ranges:

$0.1<a/(a+b+c+d)<0.9$, especially $0.5<a/(a+b+c+d)<0.8$, $0.1<b/(a+b+c+d)<0.5$, especially $0.1<b/(a+b+c+d)<0.4$, $0.1<c/(a+b+c+d)<0.5$, especially $0.1<c/(a+b+c+d)<0.4$, and $0.01<d/(a+b+c+d)<0.2$, especially $0.02<d/(a+b+c+d)<0.1$.

More preferably, a, b, c and d satisfy the range:

$0<(b+c)/(a+b+c+d)\leq0.8$, especially $0.07\leq(b+c)/(a+b+c+d)\leq0.5$.

If any one of a, b and c is 0, there may result a reduced contrast of alkali dissolution rate and a poor resolution. If the proportion of b+c to the total is more than 0.8 or if the proportion of d to the total is more than 0.2, the polymer may become gel due to over crosslinking, lose solubility in alkali solution, induce film thickness changes, internal stresses or bubbles upon alkali development, and become less adhesive to the substrate due to the shortage of hydrophilic groups. By properly selecting the values of a, b, c and d within the above-defined ranges, it becomes possible to control the size and configuration of a resist pattern as desired.

With the properties of the resist composition taken into account, e, f, g and h in formula (7) are positive numbers providing the total e+f+g+h=1, and they preferably satisfy the ranges:

$0<h/(e+f+g+h)\leq0.5$, especially $0.2<h/(e+f+g+h)\leq0.4$;

$0\leq g/(e+f+g+h)\leq0.2$, especially $0.01<g/(e+f+g+h)\leq0.1$;

and $0\leq f/(e+f+g+h)\leq0.05$, especially $0\leq f/(e+f+g+h)\leq0.02$.

If h is 0, indicating that the polymer of formula (7) does not contain the unit accompanied with h, there may result a reduced contrast of alkali dissolution rate and a poor resolution. If the proportion of e is too high, the alkali dissolution rate of unexposed areas may become too high. If both f and g are 0, there may result shortcomings such as poor resolution and poor dry etching resistance. By properly selecting the values of e, f, g and h within the above-defined ranges, it becomes possible to control the size and configuration of a resist pattern as desired.

The polymers of formulas (6) and (7) each should have a weight average molecular weight (Mw) of 1,000 to 500,000, and preferably 3,000 to 30,000. With too low a Mw, the resist composition becomes less resistant to heat. With too high a Mw, alkali dissolution is reduced and a footing phenomenon tends to arise after pattern formation.

In the polymers of the invention, if the polyhydroxystyrene-(meth)acrylate copolymer has a wide molecular weight distribution or dispersity (Mw/Mn), it becomes difficult to design the number of crosslinks because of the presence of lower and higher molecular weight polymer components. This sometimes precludes consistent formulation of resist compositions to the same performance. The influences of molecular weight and dispersity become stronger as the pattern rule becomes finer. Therefore, the polyhydroxystyrene-(meth)acrylate copolymer should preferably have a narrow dispersity (Mw/Mn) of 1.0 to 2.0, especially 1.0 to 1.5, in order to provide a resist composition suitable for micropatterning to a small feature size.

The chemically amplified positive resist composition preferably contains the following components:
(a) an organic solvent,
(b) the polymer of above formula (6) or (7) as a base resin,
(c) a photoacid generator,
(d) a basic compound, and
(e) the compound of formula (2).

In the chemical amplification, positive resist composition, component (a) is an organic solvent as illustrated above as component (A). Illustrative, non-limiting, examples of the organic solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the base resin in the chemically amplified positive resist composition. The concentration is not limited to this range as long as film formation by existing methods is possible.

The photoacid generator (c) is a compound capable of generating an acid upon exposure to high energy radiation as illustrated above as component (C). Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl) diphenylsulfonium, bis(3-tert-butoxyphenyl) phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl) sulfonium, (4-tert-butoxycarbonylmethyloxyphenyl) diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl) iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl) diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl) diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl) diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo [2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl) methane, bis(4-methylphenylsulfonyl)methane, bis(2- naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (c) is 0 to 20 parts, and especially 1 to 10 parts by weight per 100 parts by weight of the base resin in the composition. The photoacid generators may be used alone or in admixture of two or more. The transmittance of the resist film can be controlled by using a photoacid generator having a low transmittance at the exposure wavelength and adjusting the amount of the photoacid generator added.

The basic compound (d) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds (d) are as illustrated above for component (D) and include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Their illustrative examples are as described above.

The basic compounds may be used alone or in admixture of two or more. The basic compound is preferably formulated in an amount of 0 to 2 parts, and especially 0.01 to 1 part by weight, per 100 parts by weight of the base resin in the resist composition. The use of more than 2 parts of the basis compound would result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products K.K.), Megaface F171, F172 and F173 (Dai-Nippon Ink & Chemicals K.K.), Florade FC430 and FC431 (Sumitomo 3M K.K.), Aashiguard AG710, Surflon S-381, S-382, SC101, SC102, SC103, SC104, SC105, SC106, Surfynol E1004, KH-10, KH-20, KH-30 and KH-40 (Asahi Glass K.K.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin in the resist composition.

For the microfabrication of integrated circuits, any well-known lithography may be used to form a resist pattern from the chemical amplification, positive working, resist composition comprising (a) an organic solvent, (b) a polymer of formula (3) to (7), (c) a photoacid generator, and (e) a compound of formula (2), as illustrated above.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, x-rays, excimer laser light, γ-rays and synchrotron radiation. With any of the above-described parameters outside the above-described range, the process may sometimes fail to produce the desired pattern.

The chemical amplification type, positive working resist composition comprising the compound containing at least two functional groups of formula (1) are of high performance in that it has a high sensitivity, resolution, dry etching resistance and process adaptability, and is improved in the slimming of a pattern film following development with an aqueous base solution.

In a method for forming a contact hole pattern using a chemically amplified positive resist composition comprising a polymer as the base resin, involving the thermal flow step of heat treating the contact hole pattern for further reducing the size of contact holes, the addition to the composition of a compound having functional groups of formula (1) capable of crosslinking with the polymer enables easy control of the size reduction by thermal flow, makes the process compliant and assists in forming a distinct pattern profile. The composition is then capable of forming a microsize contact hole pattern suited for the fabrication of VLSI.

EXAMPLE

Examples of the invention are given below by way of illustration and not by way of limitation.

Example/Comparative Example I

Resist compositions were prepared according to the formulation shown in Tables 1 and 2. The components listed in Tables 1 and 2 have the following meaning.

Polymer A: poly(p-hydroxystyrene) in which hydrogen atoms of hydroxyl groups are substituted with 30 mol % of 1-ethoxyethyl groups, having a weight average molecular weight of 12,000.

Polymer B: poly(p-hydroxystyrene) in which hydrogen atoms of hydroxyl groups are substituted with 15 mol % of 1-ethoxyethyl groups and 15 mol % of tert-butoxycarbonyl groups, having a weight average molecular weight of 12,000.

Polymer C: poly(p-hydroxystyrene) in which hydrogen atoms of hydroxyl groups are substituted with 30 mol % of 1-ethoxypropyl groups, having a weight average molecular weight of 13,000.

Polymer D: poly(p-hydroxystyrene) in which hydrogen atoms of hydroxyl groups are substituted with 26 mol % of 1-ethoxypropyl groups and 10 mol % of tert-butyloxycarbonylmethyl groups, having a weight average molecular weight of 13,000.

Polymer E: poly(p-hydroxystyrene) in which hydrogen atoms of hydroxyl groups are substituted with 25 mol % of 1-ethoxypropyl groups and crosslinked with 5 mol % of 1,4-butanediol divinyl ether, having a weight average molecular weight of 14,000.

Polymer F: p-hydroxystyrene-1-ethylcyclopentyl methacrylate copolymer with a compositional ratio (molar ratio) of 70:30, having a weight average molecular weight of 11,000.

Polymer G: p-hydroxystyrene-1-ethoxycyclopentyl methacrylate-p-tert-butoxystyrene copolymer with a compositional ratio (molar ratio) of 60:30:10, having a weight average molecular weight of 12,000.

Polymer H: p-hydroxystyrene-p-(1-ethyloxyethyloxy)styrene-1-ethylcyclopentyl methacrylate copolymer with a compositional ratio (molar ratio) of 60:30:10, having a weight average molecular weight of 13,000.

Polymer I: p-hydroxystyrene-p-(1-ethyloxyethyloxy)styrene-tert-butyl methacrylate copolymer with a compositional ratio (molar ratio) of 60:30:10, having a weight average molecular weight of 14,000.

Polymer J: p-hydroxystyrene-p-(1-ethyloxyethyloxy)styrene-1-ethylcyclopentyl methacrylate copolymer with a compositional ratio (molar ratio) of 60:30:10, in which phenolic hydroxyl groups are crosslinked with 3 mol % of 1,4-butanediol divinyl ether, the copolymer having a weight average molecular weight of 13,000.

PAG1: (4-tert-butoxyphenyl)diphenylsulfonium p-toluenesulfonate
PAG2: (4-tert-butoxyphenyl)diphenylsulfonium 1-camphorsulfonate
PAG3: bis(tert-butylsulfonyl)diazomethane
PAG4: bis(cyclohexylsulfonyl)diazomethane
PAG5: bis(2,4-dimethylphenylsulfonyl)diazomethane
Basic compound I: tri-n-butylamine
Basic compound II: triethanolamine
Surfactant α: FC-430 (Sumitomo 3M K.K.)
Solvent 1: propylene glycol methyl ether acetate
Solvent 2: ethyl lactate

TABLE 1

| Composition (pbw) | Composition | | | | | | | | |
|---|---|---|---|---|---|---|---|---|---|
| | (1) | (2) | (3) | (4) | (5) | (6) | (7) | (8) | (9) |
| Polymer A | 80 | 80 | 80 | — | 40 | — | 40 | — | — |
| Polymer B | — | — | — | 80 | 40 | — | — | — | — |
| Polymer C | — | — | — | — | — | 80 | 40 | 40 | — |
| Polymer D | — | — | — | — | — | — | — | 40 | 80 |
| Polymer E | — | — | — | — | — | — | — | — | — |
| Polymer F | — | — | — | — | — | — | — | — | — |
| Polymer G | — | — | — | — | — | — | — | — | — |
| Polymer H | — | — | — | — | — | — | — | — | — |
| Polymer I | — | — | — | — | — | — | — | — | — |
| Polymer J | — | — | — | — | — | — | — | — | — |

TABLE 1-continued

| Composition (pbw) | Composition | | | | | | | | |
|---|---|---|---|---|---|---|---|---|---|
| | (1) | (2) | (3) | (4) | (5) | (6) | (7) | (8) | (9) |
| PAG1 | 1.0 | 1.0 | — | 1.0 | 1.0 | 1.0 | — | — | — |
| PAG2 | — | — | — | — | — | — | 1.0 | 1.0 | — |
| PAG3 | 2.0 | — | — | — | — | — | — | — | — |
| PAG4 | — | 2.0 | 1.0 | 2.0 | 2.0 | — | — | — | 1.0 |
| PAG5 | — | — | 2.0 | — | — | 2.0 | 2.0 | 2.0 | 2.0 |
| Basic compound I | — | — | — | 0.20 | 0.20 | — | — | 0.20 | — |
| Basic compound II | 0.20 | 0.20 | 0.20 | — | — | 0.20 | 0.20 | — | 0.20 |
| Surfactant α | 0.15 | 0.15 | 0.15 | 0.15 | 0.15 | 0.15 | 0.15 | 0.15 | 0.15 |
| Solvent 1 | 300 | 300 | 300 | 300 | 300 | 300 | 300 | 300 | 430 |
| Solvent 2 | 130 | 130 | 130 | 130 | 130 | 130 | 130 | 130 | — |

TABLE 2

| Composition (pbw) | Composition | | | | | | | | |
|---|---|---|---|---|---|---|---|---|---|
| | (10) | (11) | (12) | (13) | (14) | (15) | (16) | (17) | (18) |
| Polymer A | — | — | — | — | — | — | — | — | — |
| Polymer B | 40 | 40 | 24 | — | 35 | — | — | — | — |
| Polymer C | — | — | — | — | — | — | — | — | — |
| Polymer D | — | — | — | — | — | — | — | — | — |
| Polymer E | 40 | 40 | 56 | — | 35 | — | — | — | — |
| Polymer F | — | — | — | 80 | 10 | — | — | — | — |
| Polymer G | — | — | — | — | — | 80 | — | — | — |
| Polymer H | — | — | — | — | — | — | 80 | — | — |
| Polymer I | — | — | — | — | — | — | — | 80 | — |
| Polymer J | — | — | — | — | — | — | — | — | 80 |
| PAG1 | 1.0 | — | — | — | — | — | — | — | — |
| PAG2 | — | — | — | 1.0 | 1.0 | 1.0 | 1.0 | 1.0 | 1.0 |
| PAG3 | — | — | — | — | — | — | — | — | — |
| PAG4 | 2.0 | 1.0 | 1.0 | — | — | — | — | — | — |
| PAG5 | — | 2.0 | 2.0 | — | 0.6 | — | — | — | — |
| Basic compound I | — | — | — | — | — | — | — | — | — |
| Basic compound II | 0.20 | 0.20 | 0.20 | 0.20 | 0.20 | 0.20 | 0.20 | 0.20 | 0.20 |
| Surfactant α | 0.15 | 0.15 | 0.15 | 0.15 | 0.15 | 0.15 | 0.15 | 0.15 | 0.15 |
| Solvent 1 | 300 | 430 | 430 | 300 | 300 | 300 | 300 | 300 | 300 |
| Solvent 2 | 130 | — | — | 130 | 130 | 130 | 130 | 130 | 130 |

To the thus prepared resist solutions, compounds for controlling the flow rate in the thermal flow process according to the invention (referred to as Additive below) were added in a proportion based on the entire resist system as shown in Tables 3 to 20.

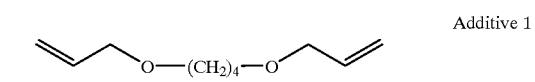
Additive 1

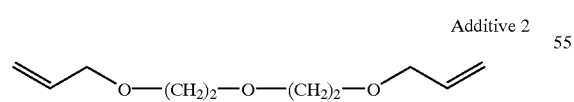
Additive 2

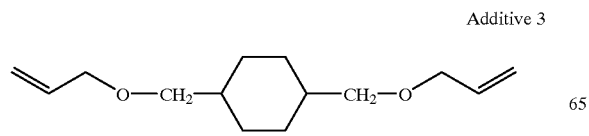
Additive 3

-continued

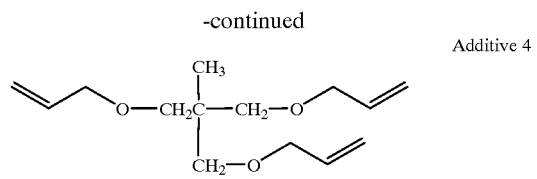
Additive 4

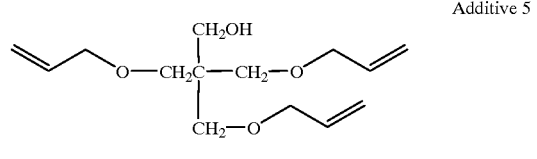
Additive 5

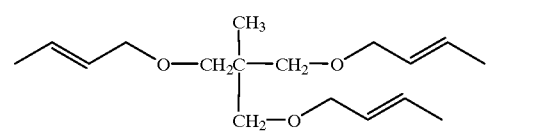
Additive 6

TABLE 3

| Example | Example 1 | Example 2 | Example 3 | Example 4 | Example 5 | Example 6 | Example 7 | Example 8 |
|---|---|---|---|---|---|---|---|---|
| Resist composition | Composition (1) | Composition (1) | Composition (1) | Composition (1) | Composition (1) | Composition (1) | Composition (1) | Composition (1) |
| Additive | Additive 1 | Additive 1 | Additive 1 | Additive 2 | Additive 2 | Additive 2 | Additive 3 | Additive 3 |
| Amount (%) | 0.5 | 0.8 | 1.6 | 0.5 | 0.8 | 1.6 | 0.5 | 0.8 |

| Example | Example 9 | Example 10 | Example 11 | Example 12 | Example 13 | Example 14 | Example 15 | Comparative Example 1 |
|---|---|---|---|---|---|---|---|---|
| Resist composition | Composition (1) | Composition (1) | Composition (1) | Composition (1) | Composition (1) | Composition (1) | Composition (1) | Composition (1) |
| Additive | Additive 3 | Additive 5 | Additive 5 | Additive 5 | Additive 6 | Additive 6 | Additive 6 | — |
| Amount (%) | 1.6 | 0.5 | 0.8 | 1.6 | 0.5 | 0.8 | 1.6 | 0 |

TABLE 4

| Example | Example 16 | Example 17 | Example 18 | Comparative Example 2 |
|---|---|---|---|---|
| Resist composition | Composition (2) | Composition (2) | Composition (2) | Composition (2) |
| Additive | Additive 1 | Additive 3 | Additive 5 | — |
| Amount (%) | 0.8 | 0.8 | 0.8 | 0 |

TABLE 5

| Example | Example 19 | Example 20 | Example 21 | Example 22 | Example 23 | Example 24 | Example 25 | Example 26 | Comparative Example 3 |
|---|---|---|---|---|---|---|---|---|---|
| Resist composition | Composition (3) | Composition (3) | Composition (3) | Composition (3) | Composition (3) | Composition (3) | Composition (3) | Composition (3) | Composition (3) |
| Additive | Additive 2 | Additive 3 | Additive 5 | Additive 5 | Additive 5 | Additive 6 | Additive 6 | Additive 6 | — |
| Amount (%) | 0.8 | 0.8 | 0.5 | 0.8 | 1.6 | 0.5 | 0.8 | 1.6 | 0 |

TABLE 6

| Example | Example 27 | Comparative Example 4 |
|---|---|---|
| Resist composition | Composition (4) | Composition (4) |
| Additive | Additive 5 | — |
| Amount (%) | 1.6 | 0 |

TABLE 7

| Example | Example 28 | Example 29 | Example 30 | Example 31 | Example 32 | Comparative Example 5 |
|---|---|---|---|---|---|---|
| Resist composition | Composition (5) | Composition (5) | Composition (5) | Composition (5) | Composition (5) | Composition (5) |
| Additive | Additive 1 | Additive 2 | Additive 3 | Additive 5 | Additive 6 | — |
| Amount (%) | 1.6 | 1.6 | 1.6 | 1.6 | 1.6 | 0 |

TABLE 8

| Example | Example 33 | Example 34 | Example 35 | Example 36 | Example 37 | Comparative Example 6 |
|---|---|---|---|---|---|---|
| Resist composition | Composition (6) | Composition (6) | Composition (6) | Composition (6) | Composition (6) | Composition (6) |
| Additive | Additive 1 | Additive 2 | Additive 3 | Additive 5 | Additive 6 | — |
| Amount (%) | 1.6 | 1.6 | 1.6 | 1.6 | 1.6 | 0 |

TABLE 9

| Example | Example 38 | Example 39 | Example 40 | Example 41 | Comparative Example 7 |
|---|---|---|---|---|---|
| Resist composition | Composition (7) | Composition (7) | Composition (7) | Composition (7) | Composition (7) |
| Additive | Additive 1 | Additive 2 | Additive 3 | Additive 5 | — |
| Amount (%) | 2.4 | 2.4 | 2.4 | 2.4 | 0 |

TABLE 10

| Example | Example 42 | Comparative Example 8 |
|---|---|---|
| Resist composition | Composition (8) | Composition (8) |
| Additive | Additive 5 | — |
| Amount (%) | 0.8 | 0 |

TABLE 11

| Example | Example 43 | Example 44 | Comparative Example 9 |
|---|---|---|---|
| Resist composition | Composition (9) | Composition (9) | Composition (9) |
| Additive | Additive 5 | Additive 5 | — |
| Amount (%) | 0.8 | 1.6 | 0 |

TABLE 12

| Example | Example 45 | Example 46 | Example 47 | Example 48 | Comparative Example 10 |
|---|---|---|---|---|---|
| Resist composition | Composition (10) | Composition (10) | Composition (10) | Composition (10) | Composition (10) |
| Additive | Additive 1 | Additive 2 | Additive 3 | Additive 5 | — |
| Amount (%) | 1.6 | 1.6 | 1.6 | 1.6 | 0 |

TABLE 13

| Example | Example 49 | Example 50 | Example 51 | Example 52 | Comparative Example 11 |
|---|---|---|---|---|---|
| Resist composition | Composition (11) | Composition (11) | Composition (11) | Composition (11) | Composition (11) |
| Additive | Additive 1 | Additive 2 | Additive 3 | Additive 5 | — |
| Amount (%) | 1.6 | 1.6 | 1.6 | 1.6 | 0 |

TABLE 14

| Example | Example 53 | Example 54 | Example 55 | Example 56 | Comparative Example 12 |
|---|---|---|---|---|---|
| Resist composition | Composition (12) | Composition (12) | Composition (12) | Composition (12) | Composition (12) |
| Additive | Additive 1 | Additive 2 | Additive 3 | Additive 5 | — |
| Amount (%) | 1.6 | 1.6 | 1.6 | 1.6 | 0 |

TABLE 15

| Example | Example 57 | Comparative Example 13 |
|---|---|---|
| Resist composition | Composition (13) | Composition (13) |
| Additive | Additive 5 | — |
| Amount (%) | 1.6 | 0 |

TABLE 16

| Example | Example 58 | Comparative Example 14 |
|---|---|---|
| Resist composition | Composition (14) | Composition (14) |
| Additive | Additive 5 | — |
| Amount (%) | 1.6 | 0 |

TABLE 17

| Example | Example 59 | Comparative Example 15 |
|---|---|---|
| Resist composition | Composition (15) | Composition (15) |
| Additive | Additive 5 | — |
| Amount (%) | 1.6 | 0 |

TABLE 18

| Example | Example 60 | Comparative Example 16 |
|---|---|---|
| Resist composition | Composition (16) | Composition (16) |
| Additive | Additive 5 | — |
| Amount (%) | 1.6 | 0 |

TABLE 19

| Example | Example 61 | Comparative Example 17 |
|---|---|---|
| Resist composition | Composition (17) | Composition (17) |
| Additive | Additive 5 | — |
| Amount (%) | 1.6 | 0 |

TABLE 20

| Example | Example 62 | Comparative Example 18 |
|---|---|---|
| Resist composition | Composition (18) | Composition (18) |
| Additive | Additive 5 | — |
| Amount (%) | 1.6 | 0 |

The resist material thus obtained was filtered through a 0.2-μm Teflon filter. The resist solution was spin-coated onto a silicon wafer, then baked on a hot plate at 100° C. for 90 seconds to give a resist film having a thickness of 0.77 μm. The resist film was exposed using an excimer laser stepper NSR-S202A (Nikon K.K., NA 0.6) with a contact hole pattern reticle mounted thereon, then baked (PEB) at 110° C. for 90 seconds, and developed with a solution of 2.38% TMAH in water, thereby giving a contact hole pattern. The target was contact holes having a size of 0.25 μm and a pitch of 1:2 at the end of development.

In this way, contact hole patterns were formed by coating resist materials onto more than ten silicon wafers. Thereafter, heat treatment was carried out for thermal flow, that is, for contracting the contact holes. The heat treatment continued for 90 seconds on a hot plate while the temperature was changed at intervals of 2° C. among the wafers.

The size of contact holes at the end of heat treatment was measured using a scanning electron microscope (Top Down SEM). The measured data were plotted in a graph with the heat treating temperature on the abscissa and the contact hole size on the ordinate. The contact hole size was 0.25 μm prior to the heat treatment, and the temperature at which the contact hole size reached 0.15 μm was determined from the graph.

Also the gradient of thermal flow (flow rate) at the 0.15 μm size was determined from the graph. It is judged that a lower flow rate is better because the thermal flow process is more effectively controllable. Additionally, the presence of scum on the resist surface was examined under Top Down SEM, and after the resist pattern was sectioned, the inclusion of scum within the resist pattern was examined under a scanning electron microscope (Cross Sectional SEM). The cross-sectional shape of contact holes was observed under Cross Sectional SEM. A composition giving perpendicular contact hole sidewalls is judged effective.

Similar resist compositions without the inventive additives are Comparative Examples. The results of evaluation are shown in Tables 21 to 38.

In the following Tables, the "heating temperature" is the heating temperature for thermal flow at which the contact hole of 0.25 μm size was contracted to 0.15 μm; and the "contact hole shape" is the cross-sectional shape of contact holes after the thermal flow.

TABLE 21

| | Heating temperature (° C.) | Flow rate (nm/° C.) | Scum on or in resist pattern | Contact hole shape |
|---|---|---|---|---|
| Example 1 | 117 | 14.1 | nil | slightly bowed |
| Example 2 | 118 | 13.9 | nil | perpendicular |
| Example 3 | 118 | 13.2 | nil | perpendicular |
| Example 4 | 119 | 14.3 | nil | slightly bowed |
| Example 5 | 120 | 14.0 | nil | perpendicular |
| Example 6 | 115 | 13.5 | nil | perpendicular |
| Example 7 | 115 | 14.0 | nil | slightly bowed |
| Example 8 | 115 | 14.0 | nil | perpendicular |
| Example 9 | 112 | 13.8 | nil | perpendicular |
| Example 10 | 120 | 13.5 | nil | slightly bowed |
| Example 11 | 120 | 13.2 | nil | perpendicular |
| Example 12 | 118 | 12.1 | nil | perpendicular |
| Example 13 | 116 | 13.8 | nil | perpendicular |
| Example 14 | 116 | 13.2 | nil | perpendicular |
| Example 15 | 114 | 12.7 | nil | perpendicular |
| CE1 | 130 | 19.0 | nil | bowed |

TABLE 22

| | Heating temperature (° C.) | Flow rate (nm/° C.) | Scum on or in resist pattern | Contact hole shape |
|---|---|---|---|---|
| Example 16 | 116 | 13.8 | nil | perpendicular |
| Example 17 | 117 | 13.4 | nil | perpendicular |
| Example 18 | 117 | 12.9 | nil | perpendicular |
| CE2 | 130 | 19.0 | nil | bowed |

TABLE 23

| | Heating temperature (° C.) | Flow rate (nm/° C.) | Scum on or in resist pattern | Contact hole shape |
|---|---|---|---|---|
| Example 19 | 119 | 15.0 | nil | perpendicular |
| Example 20 | 117 | 14.5 | nil | perpendicular |
| Example 21 | 117 | 14.8 | nil | slightly bowed |
| Example 22 | 115 | 13.7 | nil | perpendicular |
| Example 23 | 115 | 13.0 | nil | perpendicular |
| Example 24 | 114 | 13.7 | nil | perpendicular |
| Example 25 | 116 | 13.1 | nil | perpendicular |
| Example 26 | 116 | 11.9 | some scum observed | perpendicular |
| CE3 | 124 | 19.2 | nil | bowed |

TABLE 24

| | Heating temperature (° C.) | Flow rate (nm/° C.) | Scum on or in resist pattern | Contact hole shape |
|---|---|---|---|---|
| Example 27 | 148 | 11.2 | nil | perpendicular |
| CE4 | 162 | 17.8 | nil | bowed |

TABLE 25

| | Heating temperature (° C.) | Flow rate (nm/° C.) | Scum on or in resist pattern | Contact hole shape |
|---|---|---|---|---|
| Example 28 | 144 | 13.4 | nil | perpendicular |
| Example 29 | 144 | 13.2 | nil | perpendicular |
| Example 30 | 144 | 13.0 | nil | perpendicular |
| Example 31 | 142 | 11.2 | nil | perpendicular |
| Example 32 | 138 | 11.0 | nil | perpendicular |
| CE5 | 162 | 18.1 | nil | bowed |

TABLE 26

| | Heating temperature (° C.) | Flow rate (nm/° C.) | Scum on or in resist pattern | Contact hole shape |
|---|---|---|---|---|
| Example 33 | 118 | 14.1 | nil | perpendicular |
| Example 34 | 116 | 13.6 | nil | perpendicular |
| Example 35 | 116 | 12.9 | nil | perpendicular |
| Example 36 | 120 | 11.8 | nil | perpendicular |
| Example 37 | 120 | 11.6 | nil | perpendicular |
| CE6 | 128 | 19.4 | nil | bowed |

TABLE 27

| | Heating temperature (° C.) | Flow rate (nm/° C.) | Scum on or in resist pattern | Contact hole shape |
|---|---|---|---|---|
| Example 38 | 114 | 13.7 | nil | perpendicular |
| Example 39 | 112 | 13.4 | nil | perpendicular |
| Example 40 | 111 | 13.7 | nil | perpendicular |
| Example 41 | 111 | 11.4 | nil | perpendicular |
| CE7 | 126 | 19.5 | nil | bowed |

TABLE 28

| | Heating temperature (° C.) | Flow rate (nm/° C.) | Scum on or in resist pattern | Contact hole shape |
|---|---|---|---|---|
| Example 42 | 137 | 13.4 | nil | perpendicular |
| CE8 | 146 | 18.8 | nil | bowed |

TABLE 29

| | Heating temperature (° C.) | Flow rate (nm/° C.) | Scum on or in resist pattern | Contact hole shape |
|---|---|---|---|---|
| Example 43 | 125 | 13.9 | nil | perpendicular |
| Example 44 | 123 | 11.0 | nil | perpendicular |
| CE9 | 136 | 19.3 | nil | bowed |

TABLE 30

| | Heating temperature (° C.) | Flow rate (nm/° C.) | Scum on or in resist pattern | Contact hole shape |
|---|---|---|---|---|
| Example 45 | 136 | 13.5 | nil | perpendicular |
| Example 46 | 136 | 13.6 | nil | perpendicular |
| Example 47 | 135 | 13.4 | nil | perpendicular |
| Example 48 | 146 | 11.2 | nil | perpendicular |
| CE10 | 144 | 17.0 | nil | bowed |

TABLE 31

| | Heating temperature (° C.) | Flow rate (nm/° C.) | Scum on or in resist pattern | Contact hole shape |
|---|---|---|---|---|
| Example 49 | 139 | 13.4 | nil | perpendicular |
| Example 50 | 137 | 13.6 | nil | perpendicular |
| Example 51 | 138 | 13.8 | nil | perpendicular |
| Example 52 | 137 | 11.2 | nil | perpendicular |
| CE11 | 146 | 17.2 | nil | bowed |

TABLE 32

| | Heating temperature (° C.) | Flow rate (nm/° C.) | Scum on or in resist pattern | Contact hole shape |
|---|---|---|---|---|
| Example 53 | 137 | 13.4 | nil | perpendicular |
| Example 54 | 135 | 13.4 | nil | perpendicular |
| Example 55 | 134 | 13.6 | nil | perpendicular |
| Example 56 | 135 | 11.2 | nil | perpendicular |
| CE12 | 152 | 18.0 | nil | bowed |

TABLE 33

| | Heating temperature (° C.) | Flow rate (nm/° C.) | Scum on or in resist pattern | Contact hole shape |
|---|---|---|---|---|
| Example 57 | 168 | 12.0 | nil | perpendicular |
| CE13 | 176 | 19.2 | nil | bowed |

TABLE 34

| | Heating temperature (° C.) | Flow rate (nm/° C.) | Scum on or in resist pattern | Contact hole shape |
|---|---|---|---|---|
| Example 58 | 155 | 11.6 | nil | perpendicular |
| CE14 | 158 | 16.9 | nil | bowed |

TABLE 35

| | Heating temperature (° C.) | Flow rate (nm/° C.) | Scum on or in resist pattern | Contact hole shape |
|---|---|---|---|---|
| Example 59 | 175 | 10.6 | nil | perpendicular |
| CE15 | 180 | 17.3 | nil | bowed |

TABLE 36

| | Heating temperature (° C.) | Flow rate (nm/° C.) | Scum on or in resist pattern | Contact hole shape |
|---|---|---|---|---|
| Example 60 | 130 | 10.9 | nil | perpendicular |
| CE16 | 156 | 17.0 | nil | bowed |

TABLE 37

| | Heating temperature (° C.) | Flow rate (nm/° C.) | Scum on or in resist pattern | Contact hole shape |
|---|---|---|---|---|
| Example 61 | 152 | 11.0 | nil | perpendicular |
| CE17 | 160 | 17.8 | nil | bowed |

TABLE 38

| | Heating temperature (° C.) | Flow rate (nm/° C.) | Scum on or in resist pattern | Contact hole shape |
|---|---|---|---|---|
| Example 62 | 134 | 11.0 | nil | perpendicular |
| CE18 | 152 | 17.4 | nil | bowed |

Example/Comparative Example II

Resist compositions were prepared according to the formulation shown in Tables 39 to 41. The components listed in the Tables have the following meaning.

Polymer K: poly(p-hydroxystyrene) in which hydroxyl groups are protected with 15 mol % of 1-ethoxyethyl groups and 15 mol % of tert-butoxycarbonyl groups, having a weight average molecular weight of 12,000.

Polymer L: poly(p-hydroxystyrene) in which hydroxyl groups are protected with 25 mol % of 1-ethoxyethyl groups and crosslinked with 3 mol % of 1,4-butanediol divinyl ether, having a weight average molecular weight of 13,000.

Polymer M: poly(p-hydroxystyrene) in which hydroxyl groups are protected with 30 mol % of 1-ethoxyethyl groups, having a weight average molecular weight of 12,000.

Polymer N: p-hydroxystyrene-1-ethylcyclopentyl methacrylate copolymer having a compositional ratio (molar ratio) of 72:28, the p-hydroxystyrene portion being crosliked with 2 mol % of 1,4-butanediol divinyl ether, the copolymer having a weight average molecular weight of 11,000.

Polymer O: p-hydroxystyrene-1-ethylcyclopentyl methacrylateisobornyl acrylate copolymer having a compositional ratio (molar ratio) of 73:22:5 and a weight average molecular weight of 16,000.

Polymer P: p-hydroxystyrene-1-ethylcyclopentyl methacrylate-1-tetrahydrofuranyl methyl methacrylate copolymer having a compositional ratio (molar ratio) of 68:27:5 and a weight average molecular weight of 16,000.

PAG11: triphenylsulfonium 4-(4'-methylphenylsulfonyloxy)phenylsulfonate

PAG12: (4-tert-butylphenyl)diphenylsulfonium 4-(4'-methylphenylsulfonyloxy)phenylsulfonate PAG13: bis(cyclohexylsulfonyl)diazomethane PAG14: bis(2,4-dimethylphenylsulfonyl)diazomethane Basic compound A: tris(2-methoxyethyl)amine Surfactant A: FC-430 (Sumitomo 3M K.K.)

Solvent A: propylene glycol methyl ether acetate

Solvent B: ethyl lactate

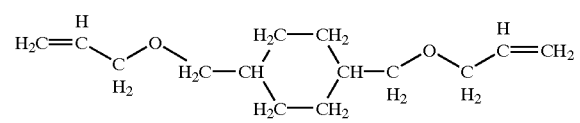

Additive 11

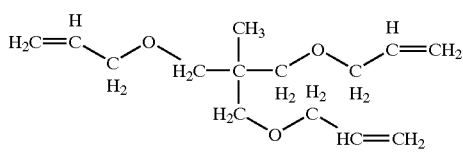

Additive 12

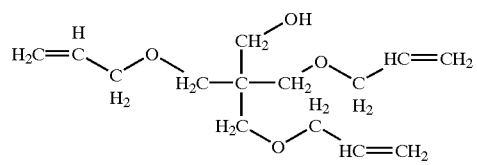

Additive 13

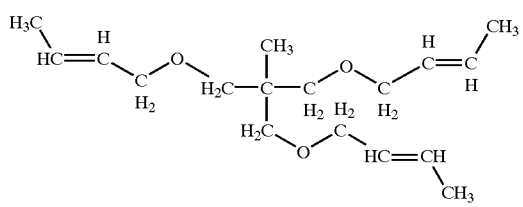

Additive 14

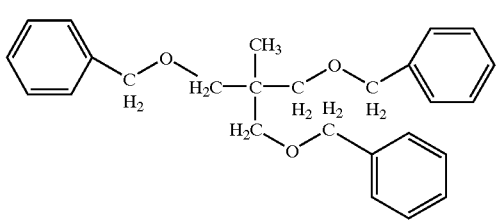

Additive 15

TABLE 39

| Composition | Example | | | | | |
|---|---|---|---|---|---|---|
| (pbw) | 63 | 64 | 65 | 66 | 67 | 68 |
| Polymer K | 80 | — | — | — | — | — |
| Polymer L | — | 80 | — | — | — | — |
| Polymer M | — | — | 80 | — | — | — |
| Polymer N | — | — | — | 80 | — | — |
| Polymer O | — | — | — | — | 80 | — |
| Polymer P | — | — | — | — | — | 80 |
| PAG11 | 1 | — | 1 | 1 | 1 | 1 |
| PAG12 | — | 1 | — | — | — | — |
| PAG13 | 2 | — | 2 | 2 | 2 | 2 |
| PAG14 | — | 2 | — | — | — | — |
| Additive 11 | — | — | — | — | — | — |
| Additive 12 | 5 | 3 | 5 | 5 | 5 | 5 |
| Additive 13 | — | — | — | — | — | — |
| Additive 14 | — | — | — | — | — | — |
| Additive 15 | — | — | — | — | — | — |
| Basic compound A | 0.2 | 0.2 | 0.2 | 0.2 | 0.2 | 0.2 |
| Surfactant A | 0.07 | 0.07 | 0.07 | 0.07 | 0.07 | 0.07 |
| Solvent A | 300 | 300 | 300 | 300 | 300 | 300 |
| Solvent B | 130 | 130 | 130 | 130 | 130 | 130 |

TABLE 40

| Composition | Example | | | | | |
|---|---|---|---|---|---|---|
| (pbw) | 69 | 70 | 71 | 72 | 73 | 74 |
| Polymer K | 80 | 80 | 80 | 80 | 80 | 80 |
| Polymer L | — | — | — | — | — | — |
| Polymer M | — | — | — | — | — | — |
| Polymer M | — | — | — | — | — | — |
| Polymer O | — | — | — | — | — | — |
| Polymer P | — | — | — | — | — | — |
| PAG11 | 1 | — | 1 | 1 | 1 | 1 |
| PAG12 | — | 1 | — | — | — | — |
| PAG13 | 2 | — | 2 | 2 | 2 | 2 |
| PAG14 | — | 2 | — | — | — | — |
| Additive 11 | 5 | — | — | — | — | 2 |
| Additive 12 | — | 5 | — | — | — | 3 |
| Additive 13 | — | — | 4 | — | — | — |
| Additive 14 | — | — | — | 5 | — | — |
| Additive 15 | — | — | — | — | 7 | — |
| Basic compound A | 0.2 | 0.2 | 0.2 | 0.2 | 0.2 | 0.2 |
| Surfactant A | 0.07 | 0.07 | 0.07 | 0.07 | 0.07 | 0.07 |
| Solvent A | 300 | 300 | 300 | 300 | 300 | 300 |
| Solvent B | 130 | 130 | 130 | 130 | 130 | 130 |

TABLE 41

| Composition | Comparative Example | | | | | |
|---|---|---|---|---|---|---|
| (pbw) | 19 | 20 | 21 | 22 | 23 | 24 |
| Polymer K | 80 | — | — | — | — | — |
| Polymer L | — | 80 | — | — | — | — |
| Polymer M | — | — | 80 | — | — | — |
| Polymer N | — | — | — | 80 | — | — |
| Polymer O | — | — | — | — | 80 | — |
| Polymer P | — | — | — | — | — | 80 |
| PAG11 | 1 | — | 1 | 1 | 1 | 1 |
| PAG12 | — | 1 | — | — | — | — |
| PAG13 | 2 | — | 2 | 2 | 2 | 2 |
| PAG14 | — | 2 | — | — | — | — |
| Additive 11 | — | — | — | — | — | — |
| Additive 12 | — | — | — | — | — | — |
| Additive 13 | — | — | — | — | — | — |
| Additive 14 | — | — | — | — | — | — |
| Additive 15 | — | — | — | — | — | — |

TABLE 41-continued

| Composition | Comparative Example | | | | | |
|---|---|---|---|---|---|---|
| (pbw) | 19 | 20 | 21 | 22 | 23 | 24 |
| Basic compound A | 0.2 | 0.2 | 0.2 | 0.2 | 0.2 | 0.2 |
| Surfactant A | 0.07 | 0.07 | 0.07 | 0.07 | 0.07 | 0.07 |
| Solvent A | 300 | 300 | 300 | 300 | 300 | 300 |
| Solvent B | 130 | 130 | 130 | 130 | 130 | 130 |

The resist materials thus obtained were each filtered through a 0.2-µm Teflon filter, thereby giving resist solutions. These resist solutions were spin-coated onto silicon wafers, then baked on a hot plate at 100° C. for 90 seconds to give resist films having a thickness of 0.6 µm.

The resist films were exposed using an excimer laser stepper NSR2005EX (Nikon K.K., NA 0.5), then baked at 110° C. for 90 seconds (post-exposure baking: PEB), and developed with a solution of 2.38% tetramethylammonium hydroxide in water, thereby giving positive patterns.

The resulting resist patterns were evaluated as described below.

Resist Pattern Evaluation

Provided that the exposure dose which provides a 1:1 resolution at the top and bottom of a 0.24-µm line-and-space pattern was the optimum exposure dose (sensitivity Eop), the minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PEB) after 24 hours of holding from exposure at the optimum dose and determining a variation in line width. The less the variation, the greater is the PED dimensional stability.

Other Evaluation

With respect to the slimming of resist film after development, the cross section of the resist film was observed under a scanning electron microscope. Film thickness change was rated "good" when the reduction of film thickness is within 0.5% (within 0.003 µm) based on the coated film thickness (0.6 µm) prior to development, "somewhat poor" for a thickness reduction within 1%, and "poor" for a thickness reduction of more than 1%.

With respect to the dry etching resistance after development, the resist film was etched, and a cross section of the pattern shape was observed under a scanning electron microscope. As a relative evaluation, the shape was rated good or poor.

The results are shown in Table 42.

TABLE 42

| | Sensitivity (mJ/cm2) | Resolution (µm) | Profile | PED stability | Film thickness change | Etching resistance |
|---|---|---|---|---|---|---|
| E63 | 27 | 0.18 | rectangular | −7 | good | good |
| E64 | 24 | 0.15 | rectangular | −9 | good | good |
| E65 | 25 | 0.2 | rectangular | −14 | somewhat poor | good |
| E66 | 25 | 0.15 | rectangular | −9 | good | good |

TABLE 42-continued

| | Sensitivity (mJ/cm2) | Resolution (μm) | Profile | PED stability | Film thickness change | Etching resistance |
|---|---|---|---|---|---|---|
| E67 | 27 | 0.2 | slightly tapered | −8 | good | good |
| E68 | 28 | 0.18 | rectangular | −8 | good | good |
| E69 | 28 | 0.21 | slightly tapered | −10 | somewhat poor | good |
| E70 | 28 | 0.18 | rectangular | −7 | good | good |
| E71 | 27 | 0.18 | rectangular | −7 | good | good |
| E72 | 28 | 0.2 | rectangular | −8 | good | good |
| E73 | 27 | 0.18 | rectangular | −7 | good | good |
| E74 | 28 | 0.18 | rectangular | −7 | good | good |
| CE19 | 29 | 0.22 | slightly tapered | −10 | somewhat poor | poor |
| CE20 | 25 | 0.18 | rectangular | −12 | somewhat poor | poor |
| CE21 | 22 | 0.22 | slightly tapered | −14 | poor | poor |
| CE22 | 25 | 0.21 | rectangular | −7 | somewhat poor | good |
| CE23 | 29 | 0.22 | slightly tapered | −10 | good | good |
| CE24 | 30 | 0.21 | slightly tapered | −8 | somewhat poor | poor |

Japanese Patent Application No. 2000-079414 is incorporated herein by reference.

Although some preferred embodiments have been described, many modifications and variations may be made thereto in light of the above teachings. It is therefore to be understood that the invention may be practiced otherwise than as specifically described without departing

What is claimed is:

1. A chemically amplified positive resist composition comprising a compound of the formula (2):

(2)

wherein X is a k-valent organic group of 2 to 20 carbon atoms, k is a positive integer of 2 to 6, and each Z, being the same or different, is a functional group of the following formula (1):

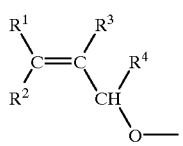

(1)

wherein $R^1$ to $R^4$ are independently hydrogen or straight, branched or cyclic alkyl groups of 1 to 12 carbon atoms, and a pair of $R^1$ and $R^3$, or a pair of $R^2$ and $R^3$, taken together, optionally form a ring.

2. The resist composition of claim 1 wherein the compound of the formula (2) is present in an amount of 0.1 to 5% by weight of the overall resist composition.

3. A chemically amplified positive resist composition for forming a contact hole pattern by a thermal flow process, comprising (A) an organic solvent, (B) a base resin in the form of a polymer having acid labile groups, (C) a photoacid generator, (D) a basic compound, and (E) the compound of formula (2), according to claim 1.

4. The resist composition of claim 3 wherein the base resin (B) is a polymer comprising recurring units of the following general formula (3) in which some of the hydrogen atoms of the phenolic hydroxyl groups are partially replaced by acid labile groups of at least one type, and some of the is hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in the formula (3), said polymer having a weight average molecular weight of 1,000 to 500,000,

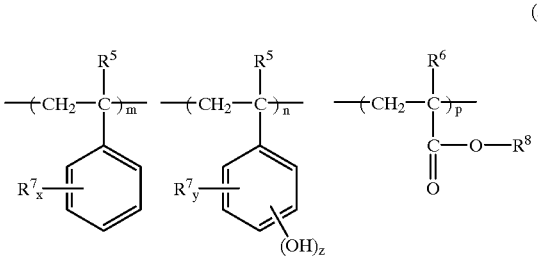

(3)

wherein $R^5$ is hydrogen or methyl, $R^6$ is hydrogen or a methyl, phenyl or cyano group, $R^7$ is a straight, branched or cyclic alkyl group of 1 to 8 carbon atoms, $R^8$ is hydrogen, a straight, branched or cyclic alkyl group of 1 to 20 carbon atoms, or an acid labile group, x and y each are 0 or a positive integer of up to 5, z is an integer satisfying y+z≦5, m and p are 0 or positive numbers, n is a positive number, satisfying 0≦m/(m+n+p)≦0.8, 0<n/(m+n+p)≦1, and 0≦p/(m+n+p)≦0.8.

5. The resist composition of claim 4 wherein the base resin (B) is a polymer represented by the following general formula (4), that is a polymer comprising recurring units of the general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3), said polymer having a weight average molecular weight of 1,000 to 500,000,

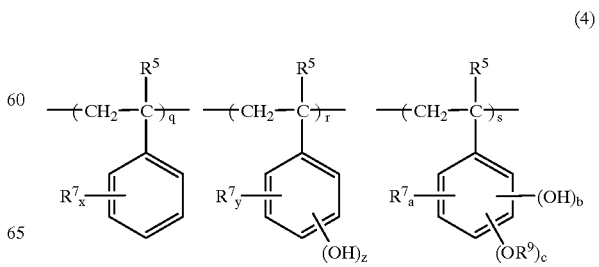

(4)

-continued

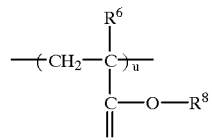
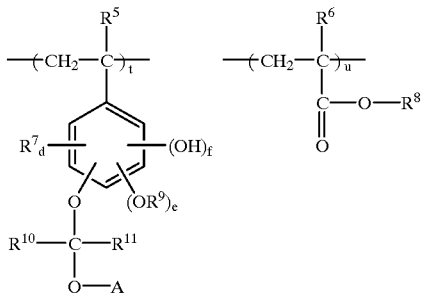

wherein A is a group of the following formula (4a):

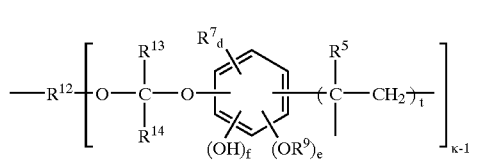

wherein $R^5$ is hydrogen or methyl, $R^6$ is hydrogen or a methyl, phenyl or cyano group, $R^7$ is a straight, branched or cyclic alkyl group of 1 to 8 carbon atoms, $R^8$ is hydrogen, a straight, branched or cyclic alkyl group of 1 to 20 carbon atoms, or an acid labile group, $R^9$ is an acid labile group of at least one type, $R^{10}$, $R^{11}$, $R^{13}$ and $R^{14}$ are independently hydrogen or straight, branched or cyclic alkyl groups of 1 to 6 carbon atoms, $R^{12}$ is a κ-valent aliphatic or alicyclic saturated hydrocarbon, aromatic hydrocarbon or heterocyclic group of 1 to 50 carbon atoms which may be separated by a hetero atom, and in which some hydrogen atoms attached to carbon atoms may be replaced by hydroxyl groups, carboxyl groups, carbonyl groups or halogen atoms, and κ is an integer of 2 to 5, each said unit may be constructed of one type or at least two types, x and y each are 0 or a positive integer of up to 5, z is an integer satisfying y+z≦5, a and b are 0 or positive integers, c is a positive integer, satisfying a+b+c≦5, d, e and f are 0 or positive integers satisfying d+e+f≦4, q, s, t and u are 0 or positive numbers, r is a positive number, satisfying 0≦q/(q+r+s+t+u)≦0.8, 0<s/(q+r+s+t+u)≦0.8, 0≦t/(q+r+s+t+u)≦0.8, 0≦u/(q+r+s+t+u)≦0.8, 0<(r+s+t)/(q+r+s+t+u)≦1, and 0<r/(q+r+s+t+u)≦0.8.

6. The resist composition of claim 5 wherein the base resin (B) is a polymer represented by the following general formula (5), that is a polymer comprising recurring units of the general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3), said polymer having a weight average molecular weight of 1,000 to 500,000,

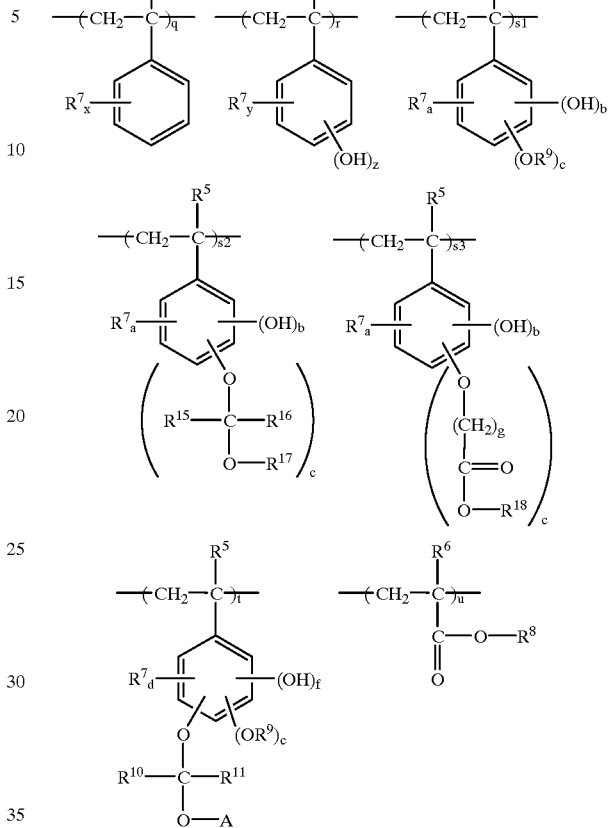

wherein $R^5$, $R^6$, $R^7$, $R^8$, $R^9$, $R^{10}$, $R^{11}$, A, x, y, z, a, b, c, d, e, and f are as defined above, $R^{15}$ and $R^{16}$ are independently hydrogen or straight, branched or cyclic alkyl groups of 1 to 8 carbon atoms, $R^{17}$ is a monovalent hydrocarbon group of 1 to 18 carbon atoms which may have a hetero atom, a pair of $R^{15}$ and $R^{16}$, a pair of $R^{15}$ and $R^{17}$ or a pair of $R^{16}$ and $R^{17}$, taken together, may form a ring, each of $R^{15}$, $R^{16}$ and $R^{17}$ is a straight or branched alkylene group of 1 to 8 carbon atom when they form a ring, $R^{18}$ is a tertiary alkyl group of 4 to 20 carbon atoms, g is 0 or a positive integer of 1 to 6, q, s1, s2, s3, t and u are 0 or positive numbers, r is a positive number, satisfying 0≦q/(q+r+s1+s2+s3+t+u)≦0.8, 0≦s1/(q+r+s1+s2+s3+t+u)≦0.8, 0≦s2/(q+r+s1+s2+s3+t+u)≦0.8, 0≦s3/(q+r+s1+s2+s3+t+u)≦0.8, 0<(s1+s2+s3)/(q+r+s1+s2+s3+t+u)≦0.8, 0≦t/(q+r+s1+s2+s3+t+u)≦0.8, 0≦u/(q+r+s1+s2+s3+t+u)≦0.8, 0<(r+s1+s2+s3+t)/(q+r+s1+s2+s3+t+u)≦1, and 0<r/(q+r+s1+s2+s3+t+u)≦0.8.

7. The resist composition of claim 3 wherein component (C) is an onium salt or diazomethane derivative or mixture thereof.

8. The resist composition of claim 3 wherein component (D) is an aliphatic amine.

9. A method for forming a contact hole pattern, comprising the steps of (i) applying the chemically amplified positive resist composition of claim 5 onto a substrate to form a coating, (ii) heat treating the coating and exposing the coating to high energy radiation with a wavelength of up to 300 nm or electron beam through a photo-mask, (iii) optionally heat treating the exposed coating, and developing the coating with a developer, thereby forming a contact hole pattern, and (iv) further heat treating the contact hole pattern for reducing the size of contact holes.

10. The resist composition of claim 1 further comprising as a base resin a polymer comprising recurring units of the following general formula (6) or (7):

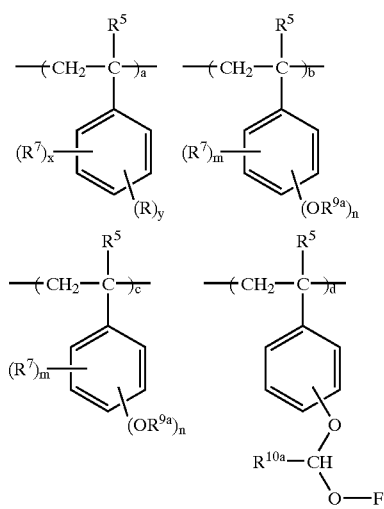

(6)

wherein F is a group of the following formula (6a):

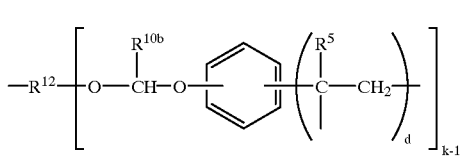

(6a)

wherein R is a hydroxyl or $OR^9$ group, $R^5$ is hydrogen or methyl, $R^7$ is a straight, branched or cyclic alkyl group of 1 to 8 carbon atoms, $R^9$, $R^{9a}$ and $R^{9b}$ each are an acid labile group $R^{10a}$ and $R^{10b}$ each are methyl or ethyl, $R^{12}$ is a κ-valent aliphatic or alicyclic saturated hydrocarbon, aromatic hydrocarbon or heterocyclic group of 1 to 50 carbon atoms which is optionally separated by a hetero atom, and in which some hydrogen atoms attached to carbon atoms are optionally replaced by hydroxyl groups, carboxyl groups, carbonyl groups or halogen atoms, arid k is an integer of 2 to 5, x is 0 or a positive integer, y is a positive integer satisfying x+y≦5, m is 0 or a positive integer, n is a positive integer satisfying m+n≦5, a, b, c and d are 0 or positive numbers satisfying a+b+c+d=1, wherein G is a group of the following formula (7a):

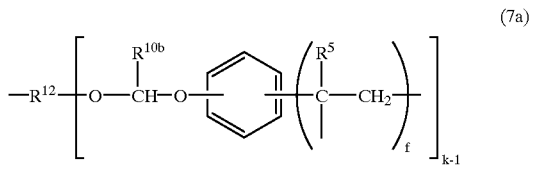

(7a)

wherein $R^5$, $R^{6a}$ and $R^{6b}$ each are hydrogen or methyl, $R^{10a}$ and $R^{10b}$ each are methyl or ethyl, $R^{12}$ is a κ-valent aliphatic or alicyclic saturated hydrocarbon, aromatic hydrocarbon or heterocyclic group of 1 to 50 carbon atoms which may be separated by a hetero atom, and in which some hydrogen atoms attached to carbon atoms may be replaced by hydroxyl groups, carboxyl groups, carbonyl groups or halogen atoms, and κ is an integer of 2 to 5, $R^{8a}$ is a straight, branched or cyclic alkyl group of 1 to 20 carbon atoms which may contain an oxygen or sulfur atom, $R^{8b}$ is a tertiary alkyl group of 4 to 20 carbon atoms, i is a positive integer of up to 5, e, f, g and h each are 0 or a positive number satisfying e+f+g+h=1.

11. A chemically amplified positive resist composition according to claim 10, further comprising an organic solvent, a photoacid generator, and a basic compound.

12. A chemically amplified positive resist composition according to claim 1, wherein the functional group(s) of formula (1) are selected from the following formulae:

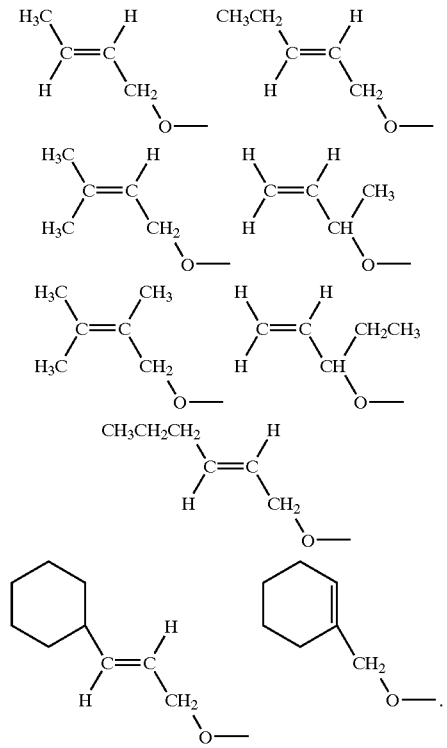

13. A chemically amplified positive resist composition according to claim 1, wherein X in formula (2) is an aliphatic, alicyclic or aromatic hydrocarbon group of 2 to 20 carbon atoms, which is optionally separated by a hetero atom and is optionally substituted by one or more halogen atoms, hydroxyl groups or alkoxy groups.

14. A chemically amplified positive resist composition according to claim 1, wherein:

k is 2 and X is ethylene, propylene, isopropylene or of one of the following formulae:
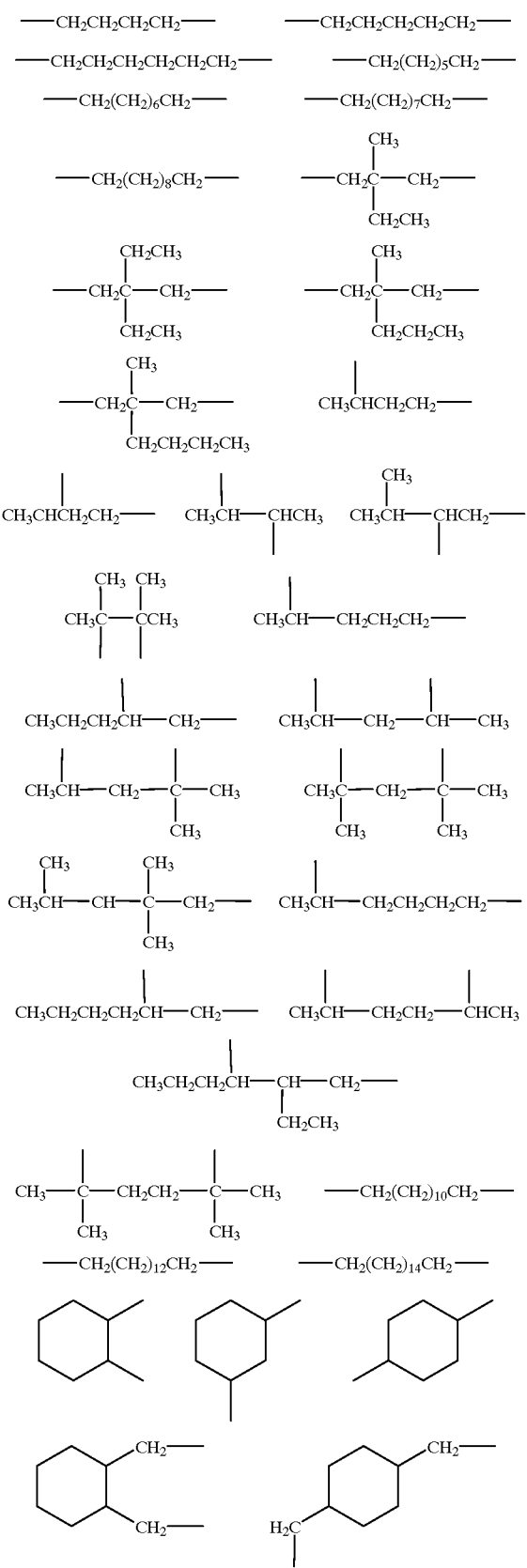
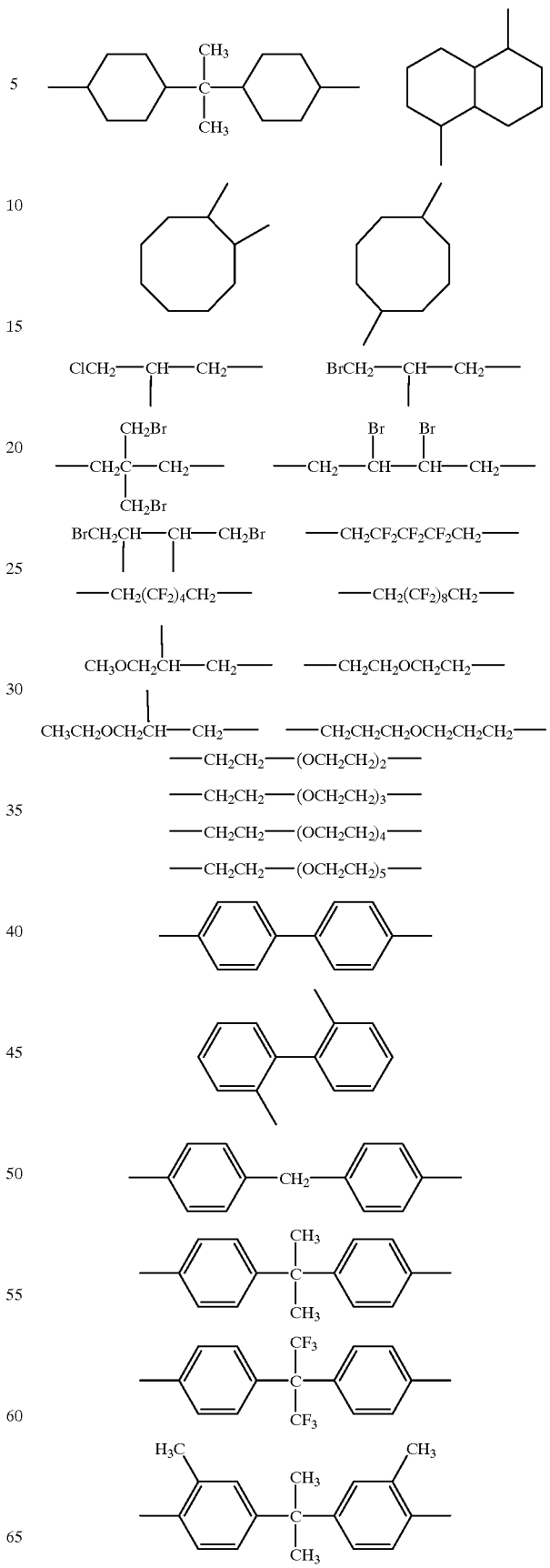

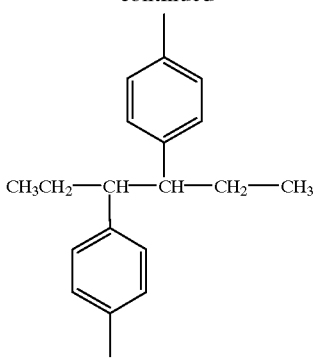

k is 3 and X is of one of the following formulae:

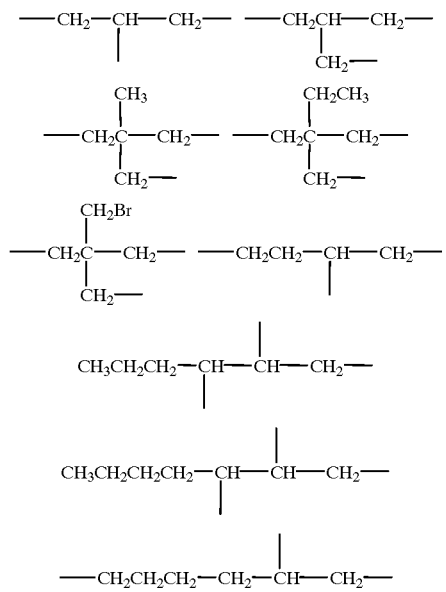

k is 4 and X is of one of the following formulae:

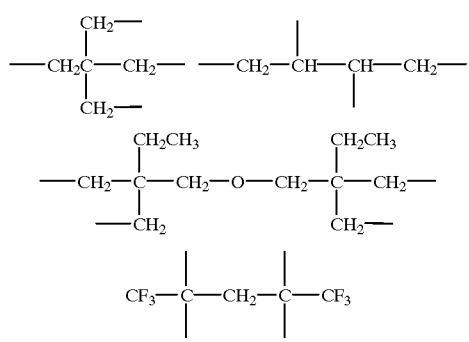

or
k is 6 and X is of one of the following formulae:

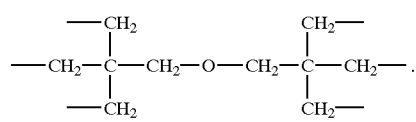

15. A chemically amplified positive resist composition according to claim 1, wherein, in formula (2), k is from 3 to 4.

16. A chemically amplified positive resist composition according to claim 1, wherein, in formula (2), X is an aliphatic or alicyclic saturated hydrocarbon group, which is optionally separated by a hetero atom and is optionally substituted by one or more halogen atoms, hydroxyl groups or alkoxy groups.

17. A chemically amplified positive resist composition according to claim 1, wherein the compound of formula (2) is one of the following compounds:

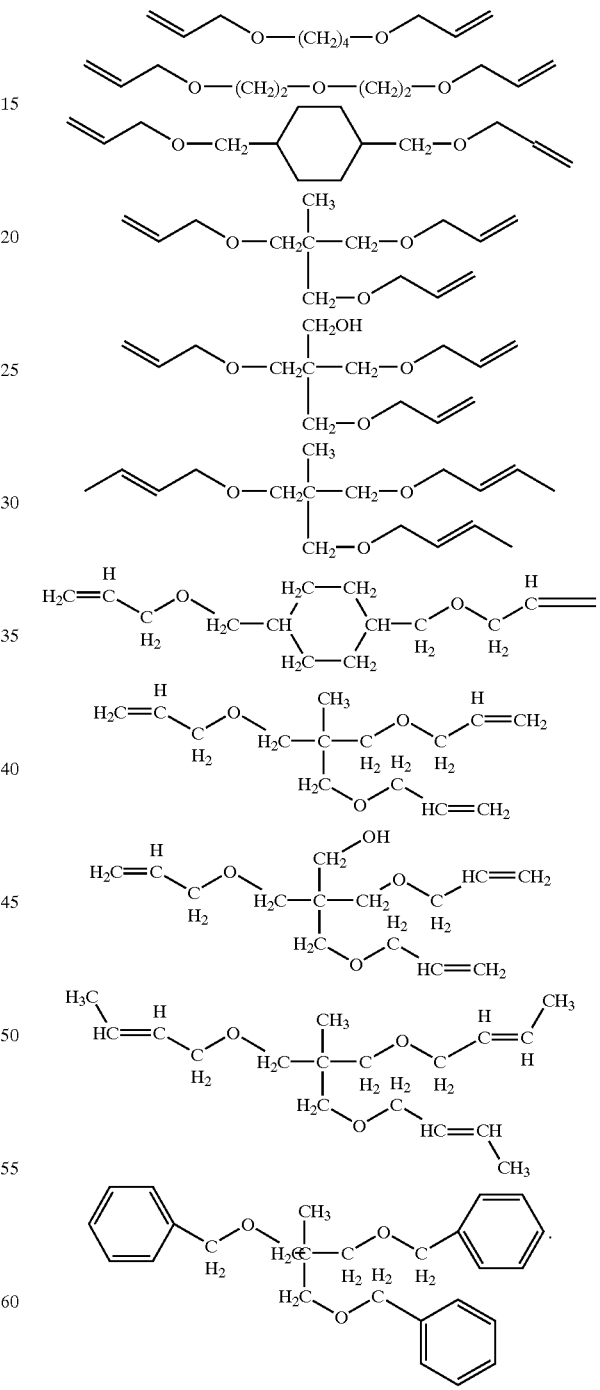

* * * * *